(12) United States Patent
Iguchi

(10) Patent No.: US 11,296,144 B2
(45) Date of Patent: Apr. 5, 2022

(54) IMAGE DISPLAY DEVICE

(71) Applicant: SHARP KABUSHIKI KAISHA, Sakai (JP)

(72) Inventor: Katsuji Iguchi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/929,817

(22) Filed: Jul. 15, 2020

(65) Prior Publication Data

US 2020/0350362 A1 Nov. 5, 2020

Related U.S. Application Data

(63) Continuation of application No. 16/414,041, filed on May 16, 2019, now Pat. No. 10,763,303.

(30) Foreign Application Priority Data

May 21, 2018 (JP) .............................. JP2018-097246

(51) Int. Cl.
*H01L 27/15* (2006.01)
*H01L 33/40* (2010.01)
(Continued)

(52) U.S. Cl.
CPC ............ *H01L 27/156* (2013.01); *H01L 25/18* (2013.01); *H01L 25/50* (2013.01); *H01L 33/24* (2013.01);
(Continued)

(58) Field of Classification Search
CPC ..... H01L 25/18; H01L 27/156; H01L 33/382; H01L 33/385; H01L 33/405; H01S 5/04257; H01S 5/18305
See application file for complete search history.

(56) References Cited

U.S. PATENT DOCUMENTS

2008/0031295 A1 2/2008 Tanaka
2009/0127568 A1 5/2009 Kinoshita et al.
(Continued)

FOREIGN PATENT DOCUMENTS

CN 101473457 A 7/2009
JP 2002-141492 A 5/2002

OTHER PUBLICATIONS

Non-Final Office Action dated Mar. 5, 2020 for U.S. Appl. No. 16/414,041.
(Continued)

*Primary Examiner* — Michael Carter
(74) *Attorney, Agent, or Firm* — ScienBiziP, P.C.

(57) ABSTRACT

Provided is a micro light emission element including a compound semiconductor in which an N-side layer, a light emission layer, and a P-side layer are laminated sequentially from a side of a light emitting surface, in which an N-electrode coupled to the N-side layer and a P-electrode coupled to the P-side layer are disposed on another surface opposite to the light emitting surface, the P-electrode is disposed on the light emission layer, the N-electrode is disposed in an isolation region which is a boundary region of the micro light emission element and isolates the light emission layer from a light emission layer of another micro light emission element, a surface of the N-electrode on a side of the other surface and a surface of the P-electrode on the side of the other surface are flush with each other, and the N-electrode and the P-electrode are both formed of a single interconnection layer.

20 Claims, 17 Drawing Sheets

(51) Int. Cl.
    *H01L 33/62*     (2010.01)
    *H01L 33/44*     (2010.01)
    *H01L 33/24*     (2010.01)
    *H01S 5/42*     (2006.01)
    *H01L 25/18*     (2006.01)
    *H01L 25/00*     (2006.01)
    *H01S 5/042*     (2006.01)
    *H01S 5/028*     (2006.01)
    *H01S 5/183*     (2006.01)
    *H01L 33/38*     (2010.01)
    *H01S 5/02325*     (2021.01)
    *H01S 5/30*     (2006.01)
    *H01L 33/00*     (2010.01)
    *H01L 33/42*     (2010.01)
    *H01L 33/30*     (2010.01)

(52) U.S. Cl.
    CPC ............ *H01L 33/38* (2013.01); *H01L 33/405* (2013.01); *H01L 33/44* (2013.01); *H01L 33/62* (2013.01); *H01S 5/028* (2013.01); *H01S 5/02325* (2021.01); *H01S 5/0425* (2013.01); *H01S 5/04257* (2019.08); *H01S 5/18347* (2013.01); *H01S 5/18375* (2013.01); *H01S 5/423* (2013.01); *H01L 33/0062* (2013.01); *H01L 33/30* (2013.01); *H01L 33/42* (2013.01); *H01L 2933/0016* (2013.01); *H01L 2933/0025* (2013.01); *H01L 2933/0066* (2013.01); *H01S 5/3013* (2013.01)

(56) References Cited

U.S. PATENT DOCUMENTS

2017/0069609 A1     3/2017     Zhang et al.
2017/0179192 A1     6/2017     Zhang et al.
2018/0190672 A1*     7/2018     Lee ..................... H01L 27/124
2019/0181300 A1     6/2019     Park et al.

OTHER PUBLICATIONS

Notice of Allowance and Fee(s) Due dated May 12, 2020 for U.S. Appl. No. 16/414,041.

* cited by examiner

← BONDING SURFACE

IMAGE DISPLAY DEVICE

BACKGROUND

1. Field

The present disclosure relates to a micro light emission element and an image display device.

2. Description of the Related Art

A display device provided with a plurality of micro light emission elements configuring a pixel on a drive circuit substrate has been proposed. As such a display device, for example, Japanese Unexamined Patent Application Publication No. 2002-141492 discloses a small display device for displaying a color image. In this display device, a drive circuit is formed on a silicon substrate, and a minute ultraviolet light emitting diode (LED) array is disposed thereon. In addition, in this display device, a wavelength conversion layer which converts ultraviolet light into visible light of red, green, and blue is provided on the ultraviolet light emitting diode.

Such a display device has characteristics of high brightness and high durability while being small. Therefore, such a display device is expected as a display device for a glasses-type terminal, a head-up display (HUD), or other display apparatuses.

In addition, in such a display device, since materials of the drive circuit substrate and the micro light emission element are different from each other and a process of bonding both of them to each other is desirable, various manufacturing methods have been proposed (see Japanese Unexamined Patent Application Publication No. 2002-141492 and U.S. Patent Application Publication No. 2017/0069609).

However, when producing the micro light emission element and the display device with the structure or the method disclosed in the above-mentioned Japanese Unexamined Patent Application Publication No. 2002-141492 and U.S. Patent Application Publication No. 2017/0069609, the following problems exist.

First, it is desirable that a compound semiconductor to be the above-described micro light emission element is stuck onto the drive circuit substrate and the compound semiconductor and the drive circuit substrate are electrically coupled together, so that current can be supplied to each micro light emission element. When coupling the compound semiconductor and the drive circuit substrate, it is only desirable to couple a P-type electrode of the micro light emission element and a corresponding anode electrode on the drive circuit substrate for each pixel.

However, the problem is how to couple an N-type electrode of the micro light emission element to a cathode electrode on the drive circuit substrate without an additional process. Japanese Unexamined Patent Application Publication No. 2002-141492 does not disclose this point. In addition, in a technology described in U.S. Patent Application Publication No. 2017/0069609, after a compound semiconductor is stuck to a drive circuit substrate and a growth substrate is peeled off, a process of forming a complicated interconnection structure is disclosed.

As described above, in a structure in which an interconnection is provided on a compound semiconductor, light emission efficiency decreases due to absorption and scattering of light by the interconnection, and a manufacturing process becomes complicated, so there are problems of difficulty in miniaturization and cost increase in manufacturing.

It is desirable to realize a micro light emission element or the like which can suppress a decrease in light emission efficiency and reduce manufacturing costs.

SUMMARY

A micro light emission element according to an aspect of the present disclosure includes a compound semiconductor in which a first conductive layer, a light emission layer, and a second conductive layer having a conductivity type opposite to a conductivity type of the first conductive layer are sequentially laminated from a side of a light emitting surface, in which a first electrode coupled to the first conductive layer and a second electrode coupled to the second conductive layer are disposed on another surface opposite to the light emitting surface, the second electrode is disposed on the light emission layer, the first electrode is disposed in an isolation region which is a boundary region of the micro light emission element and isolates the light emission layer from a light emission layer of another micro light emission element, and a surface of the first electrode on a side of the other surface and a surface of the second electrode on a side of the other surface are flush with each other and are made of a same material.

DESCRIPTION OF THE EMBODIMENTS

Figure 1:
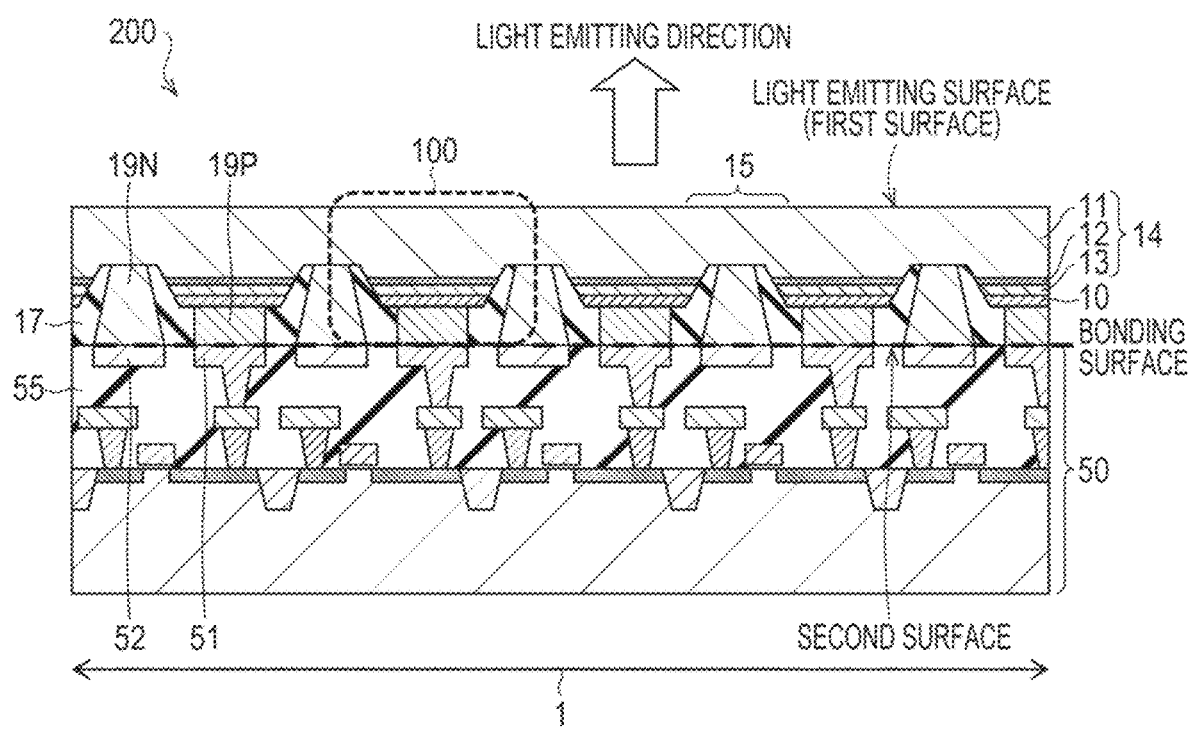
FIG. 1 is a schematic sectional view illustrating a structure of an image display device according to Embodiment 1 of the present disclosure.

[Overview of Structure of Image Display Device 200]

Hereinafter, embodiments of the present disclosure will be described with reference to the drawings by taking an image display device 200 having a plurality of micro light emission elements 100 as a light source as an example. Note that the image display device 200 has the plurality of micro light emission elements 100 in a pixel region 1. In addition, the image display device 200 is provided with a drive circuit substrate 50 with which current is supplied to the micro light emission elements 100 to emit light. Light emitted from the micro light emission elements 100 is emitted to a side opposite to the drive circuit substrate 50.

Although a wavelength conversion layer, a light diffusion layer, a color filter, a micro lens, and the like may be disposed on the light emitting side of the micro light emission elements 100, since they are not directly related to the present disclosure, they are not illustrated in the drawings.

The drive circuit substrate 50 is configured with a micro light emission element drive circuit, a row selection circuit, a column signal output circuit, an image processing circuit, an input/output circuit, and the like. The micro light emission element drive circuit controls current supplied to each of the micro light emission elements 100. In addition, the row selection circuit selects each row of the micro light emission elements 100 arranged in a two-dimensional matrix. In addition, the column signal output circuit outputs light emission signals to each column of the micro light emission elements 100. In addition, the image processing circuit calculates a light emission signal based on an input signal.

On a surface of a bonding surface side of the drive circuit substrate 50, a P-drive electrode 51 (second drive electrode) and an N-drive electrode 52 (first drive electrode) for coupling to the micro light emission element 100 are disposed. Surfaces of the P-drive electrode 51 and the N-drive electrode 52 are configured to be planarized.

The drive circuit substrate 50 is generally a silicon substrate (semiconductor substrate) on which a large-scale integrated circuit (LSI) is formed, and since it can be manufactured by a known technology, its function and configuration will not be described in detail.

Note that a cross section along a substrate surface of the micro light emission element 100 can have various planar shapes such as a rectangle, a polygon, a circle, and an ellipse, and it is assumed that the maximum length in a direction along the substrate surface is about 60 μm or less.

In addition, in the image display element 200, it is assumed that three thousand or more micro light emission elements 100 are integrated into a pixel region 1.

The micro light emission element 100 includes a compound semiconductor 14 as a light emitting body, and generally, an N-side layer 11 (first conductive layer), a light emission layer 12, and a P-side layer 13 (second conductive layer) are laminated in this order.

The compound semiconductor 14 is, for example, a nitride semiconductor (AlInGaN-based) in a micro LED element that emits light in a wavelength band from ultraviolet to green color. In addition, the compound semiconductor 14 is AlInGaP-based when emitting light in a wavelength band from yellowish green color to red color. Further, the compound semiconductor 14 is an AlGaAs-based or GaAs-based in a wavelength band from red color to infrared.

Hereinafter, regarding the compound semiconductor 14 which configures the micro light emission element 100, a configuration in which the N-side layer 11 is disposed on the light emitting side will be described. However, the compound semiconductor 14 may have a configuration in which the P-side layer 13 is disposed on the light emitting side.

Although each of the N-side layer 11, the light emission layer 12, and the P-side layer 13 is normally optimized to include a plurality of layers instead of a single layer, since it is not directly related to the present disclosure, the detailed structure of each layer will not be described. Normally, the light emission layer is interposed between the N-type layer and the P-type layer, but since the N-type layer or the P-type layer may also include a non-doped layer or a layer having a dopant with opposite conductivity in some cases, hereinafter, those are described as an N-side layer and a P-side layer.

In the following description related to the embodiments, usually one image display device 200 or a part thereof will be described. However, in a manufacturing process of the image display device 200, the process is performed on a wafer on which a plurality of image display devices 200 are arranged, and the process is complete by finally dividing the wafer into each image display device 200.

Embodiment 1

As illustrated in FIG. 1, the image display device 200 has a configuration in which the micro light emission element 100 that emits light is stuck to the drive circuit substrate 50 on a planarized bonding surface (indicated by a thick broken line). In the micro light emission element 100, the light emission layer 12 is isolated by an isolation trench 15. In a region where the light emission layer 12 remains in the pixel region 1, a P-electrode 19P (second electrode) coupled to the P-side layer 13 is disposed. Further, in a region (isolation region) of the isolation trench 15 in the pixel area 1, an N-electrode 19N (first electrode) coupled to the N-side layer 11 is disposed.

The P-electrode 19P and the N-electrode 19N are simultaneously formed by the same process as will be described later, and thus shapes, sizes, and depths are different, but as material, interconnection materials of the same structure are used. Normally, the interconnection material has a multilayer structure configured with a plurality of layers such as a barrier metal layer, a main conductive layer, and a cap layer. The P-electrode 19P and the N-electrode 19N have the same multilayer structure. That is, the image display device 200 is formed in a single interconnection layer on the side of the micro light emission element 100.

In the configuration of the present embodiment, since the P-electrode 19P and the N-electrode 19N are made of metal materials which are in ohmic contact with the N-side layer 11, an ohmic contact with the P-side layer 13 is performed through the P-electrode layer 10. For example, when the compound semiconductor 14 is a nitride semiconductor, the P-electrode layer 10 is a good conductor such as indium-tin-oxide (ITO) which is a transparent conductive electrode or palladium (Pd). The P-electrode layer 10 does not necessarily have to be a continuous thin-film, and may have, for example, a structure in which palladium nanoparticles are dispersedly allocated.

The isolation trench 15 of the micro light emission element 100 is filled with the protection layer 17, and a surface (second surface) on a bonding surface side of the protection layer 17 is planarized. The P-electrode 19P and the N-electrode 19N are formed on the bonding surface side, and the surfaces thereof are formed in a plane substantially at the same height as the surface of the protection layer 17.

In addition, a surface on a bonding surface side of an insulation layer 55 on the drive circuit substrate 50 side is also planarized, and the surfaces of the P-drive electrode 51 and the surface of the N-drive electrode 52 are formed in a plane substantially at the same height as the surface of the insulation layer 55. The P-electrode 19P and the N-electrode 19N are connected to the P-drive electrode 51 and the N-drive electrode 52 on the drive circuit substrate 50 side, respectively.

As viewed microscopically, some height difference may exist between a surface of the protection layer 17, and surfaces of the P-electrode 19P and the N-electrode 19N. When bonding is being performed, it is desirable to control the height difference so that the height difference is smaller than a height difference where the P-drive electrode 51 and the N-drive electrode 52, which are on the side facing the drive circuit substrate 50, are able to be coupled. The same applies to a height difference between a surface of the insulation layer 55 and surfaces of the P-drive electrode 51 and the N-drive electrode 52, on the drive circuit substrate 50 side.

Normally, surface layers of the P-electrode 19P and the N-electrode 19N, and surface layers of the P-drive electrode 51 and the N-drive electrode 52 are made of the same material, for example, gold (Au), copper (Cu), nickel (Ni), or the like.

Figure 2A:
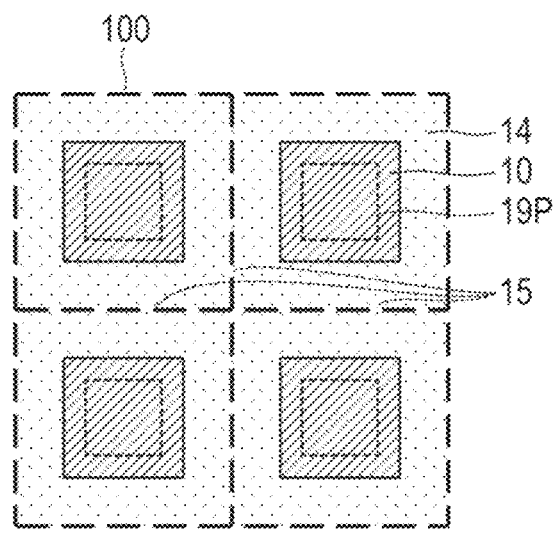
FIGS. 2A and 2B are schematic plan views of a micro light emission element according to Embodiment 1 of the present disclosure when viewed from a light emitting side.
Figure 2B:
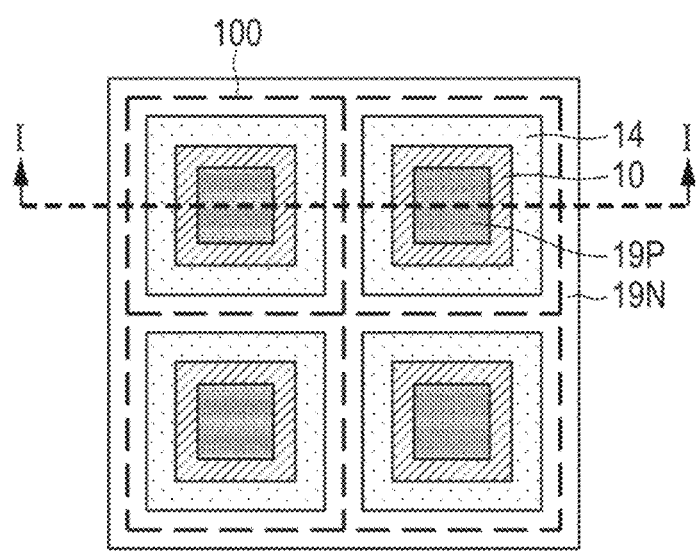

The micro light emission elements 100 are generally arranged in a two-dimensional array when viewed from the bonding surface side. As illustrated in FIG. 2B, the P-electrode 19P is disposed at a center portion of the micro light emission element 100, and the N-electrode 19N is disposed at a boundary portion thereof. At a lower portion of the N-electrode 19N, as illustrated in FIG. 2A, an isolation trench 15 is present. Note that FIG. 1 illustrates I-I cross section in FIG. 2B. In addition, FIG. 2A illustrates a surface after forming isolation trenches 15 (state of FIG. 3B). Furthermore, FIG. 2B illustrates a surface after forming the P-electrode 19P and the N-electrode 19N (state of FIG. 3E). However, the protection layer 17 is omitted.

In the manufacturing process of the image display device 200, instead of manufacturing each image display device as illustrated in FIG. 1, a plurality of image display devices 200 can be manufactured at a time by bonding together a wafer in which a plurality of drive circuit substrates 50 are disposed and a wafer in which a plurality of micro light emission elements 100 are disposed.

By bonding the wafers together, dust generation can be reduced and high yield can be realized.

Furthermore, at the time when the wafers are stuck, a current path between the micro light emission element 100 and the drive circuit substrate 50 is completed, so that it is not necessary to form an interconnection on a light emitting surface (first surface) after the bonding. As a result, it is possible to inhibit a decrease in light emission efficiency due to light absorption by the interconnection of the light emitting surface, and possible to simplify the manufacturing process of the image display device 200. In addition, since each micro light emission elements 100 is bonded to the corresponding micro light emission element drive circuit, the problem that interconnection resistance is different for each micro light emission element 100 does not occur.

Figure 3A:
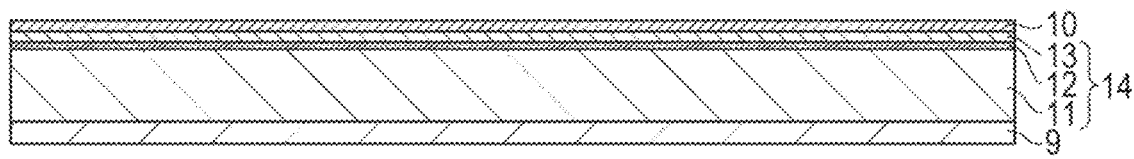
FIGS. 3A to 3E are schematic sectional views illustrating a manufacturing process of the micro light emission element according to Embodiment 1 of the present disclosure.

Next, the manufacturing process of the micro light emission element 100 will be described with reference to FIGS. 3A to 3E. As illustrated in FIG. 3A, the N-side layer 11, the light emission layer 12, and the P-side layer 13, which constitute the compound semiconductor, are sequentially laminated on the growth substrate 9, and the P-electrode layer 10 is further deposited.

Figure 3B:
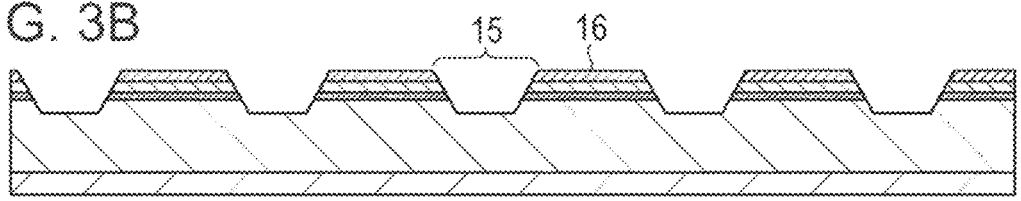

Next, as illustrated in FIG. 3B, the isolation trenches 15 are formed by etching the P-electrode layer 10, P-side layer 13, light emission layer 12, and a part of the N-side layer 11. At this time, a part including the light emission layer 12 becomes a mesa 16.

As illustrated in FIG. 2A, the isolation trenches 15 are arranged at equal intervals in longitudinal and lateral directions, and the mesas 16 have a shape of a truncated square cone. However, the shape of the mesa 16 is not limited to a truncated square cone, and may be a truncated circular cone or other truncated polygon cones.

A side wall of the mesa 16 is desirably inclined at about 45°±10° with respect to a surface formed by the light emission layer 12. Among the light emitted from the light emission layer 12, the ratio of light traveling in a direction parallel to the light emission layer 12 is the largest. Therefore, by reflecting such light in a direction of the light emitting surface, the light output efficiency of the micro light emission element 100 can be enhanced.

When the side wall of the mesa 16 is vertical, light emitted in a horizontal direction repeats reflection, is absorbed by the vertical wall and therefore is not emitted to the outside from the light emitting surface. When the inclination of the side wall of the mesa 16 largely deviates from 45 degrees, an incident angle when the light incident on the light emitting surface becomes large to cause total reflection on the light emitting surface and the light is also not emitted to the outside.

Figure 3C:
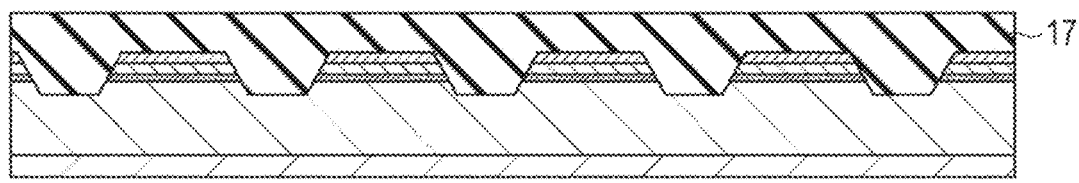

Next, as illustrated in FIG. 3C, the protection layer 17 is deposited and the surface is planarized by chemical mechanical polishing (CMP). The protection layer 17 is an insulation layer, and is, for example, made of $SiO_2$, SiN, SiON, or a multilayer film of these films. Various film formation technologies such as a chemical vapor deposition (CVD) method, a sputtering method, and coating can be used for forming the protection layer 17.

Figure 3D:
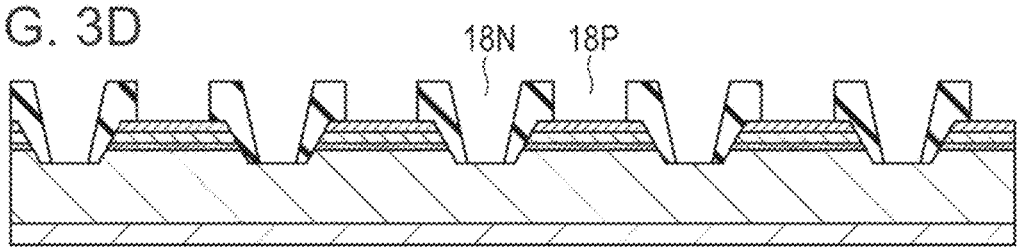

Next, as illustrated in FIG. 3D, a P-groove 18P is formed on the mesa 16, and an N-groove 18N is formed on the isolation trench 15. The P-groove 18P has a hole shape and reaches the P-electrode layer 10. The N-groove 18N has a channel shape running in both longitudinal and lateral directions, and reaches the N-side layer 11 at a bottom portion of the isolation trench 15.

Figure 3E:
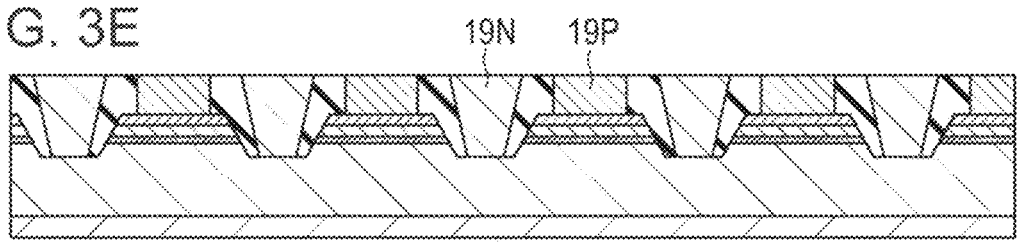

Further, as illustrated in FIG. 3E, by using a Damascene method, the P-electrode 19P and the N-electrode 19N are formed by filling the P-groove 18P and the N-groove 18N with a metal film. The metal film is, for example, a combination of a barrier film such as tantalum (Ta), tungsten (W), and titanium nitride (TiN), and copper. A combination of gold or nickel or the like with a corresponding barrier film may be used. In the Damascene method, a metal thin film is deposited on a substrate structure having a trench and a CMP is performed, thereby the metal thin film can remain in the trench and the surface is planarized.

Here, the Damascene method is one of metal interconnection formation methods of LSI, and is a thin film formation technology using a plating technology and a CMP method in combination. The Damascene method is referred to as a damascene skill in which a fine metal interconnection layer is implanted in an insulation layer. The method is focused on copper (Cu) interconnection, and a trench having an interconnection shape is formed in an insulating interlayer and is filled with a metal such as copper. There are two interconnection methods, one is called "single Damascene interconnection method", which is a method of forming an interconnection trench after forming a metal contact plug in a through hole. The other is called "dual Damascene interconnection method", which is a method of filling a through hole and an interconnection trench with a metal at a time after forming the through hole and the interconnection trench. The Damascene method is used in combination with a CMP technology to planarize a multilayered interconnection layer. The process of FIGS. 3A to 3E uses the single Damascene method.

As described above, the P-electrode 19P is disposed on the mesa 16, the N-electrode 19N is disposed on the isolation trench 15, and both the P-electrode 19P and the N-electrode 19N are disposed on surfaces to be the bonding surface (on the same plane), and the surfaces are configured to be planarized with the same material. That is, both the P-electrode 19P and the N-electrode 19N surfaces are flush with each other and are made of a same material.

In the configuration of the present embodiment, the interconnection layer is configured with one layer, and it can be formed by a two-step photolithography process of forming the isolation trench 15 and the mesa 16, and forming the P-groove 18P and the N-groove 18N. Therefore, the micro light emission element 100 may be manufactured with a very simple manufacturing process, and the equipment investment can be reduced and the manufacturing costs can be significantly reduced.

Here, the photolithography is a technology for generating patterns formed in an exposed part and in an unexposed part by exposing a surface of a substance coated with a photosensitive substance in the patterns.

Figure 4A:
FIGS. 4A to 4D are schematic sectional views illustrating a manufacturing process of the image display device according to Embodiment 1 of the present disclosure.

Next, the manufacturing process of the image display device 200 will be described with reference to FIGS. 4A to 4D. As illustrated in FIG. 4A, the micro light emission element 100 is formed through the process of FIGS. 3A to 3E. FIG. 4A is a view obtained by inverting the configuration illustrated in FIG. 3E in a top-bottom direction.

Figure 4B:
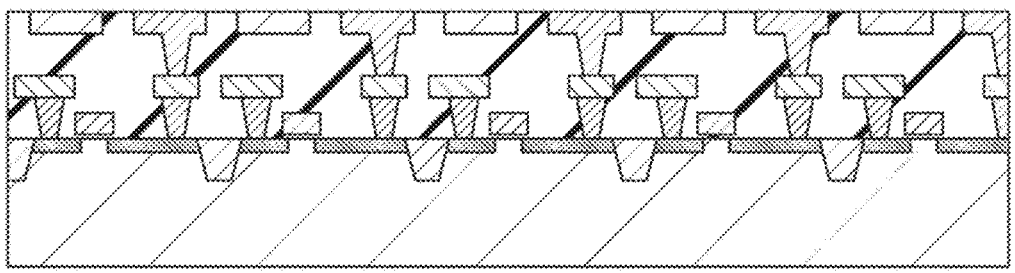

In addition, as illustrated in FIG. 4B, the drive circuit substrate 50 is manufactured. The drive circuit substrate 50 is formed, for example, on a single crystal silicon substrate (wafer) by a usual complementary metal-oxide semiconductor (CMOS) process.

Here, it is desirable that both the micro light emission element 100 and the drive circuit substrate 50 be in a wafer state. For example, if the micro light emission elements 100 are divided into individual pieces by the units of the image display devices 200, a large amount of dust is generated in a dividing process, so the dust adheres to the bonding surface in the bonding process and a problem occurs that the bonding yield significantly decreases. Such a problem does not occur if the micro light emission element 100 and the drive circuit substrate 50 are wafers.

In addition, it is further desirable that both wafers of a growth substrate 9 of the micro light emission element 100 and the drive circuit substrate 50 are made of the same material. This is because heating may be desirable when bonding is performed, and if both wafer materials are the same, it is possible to suppress a pattern deviation due to a difference in thermal expansion coefficient. Furthermore, it is desirable that both wafers have the same size. If the sizes are different, a useless region which is not used is generated on a larger wafer.

Figure 4C:
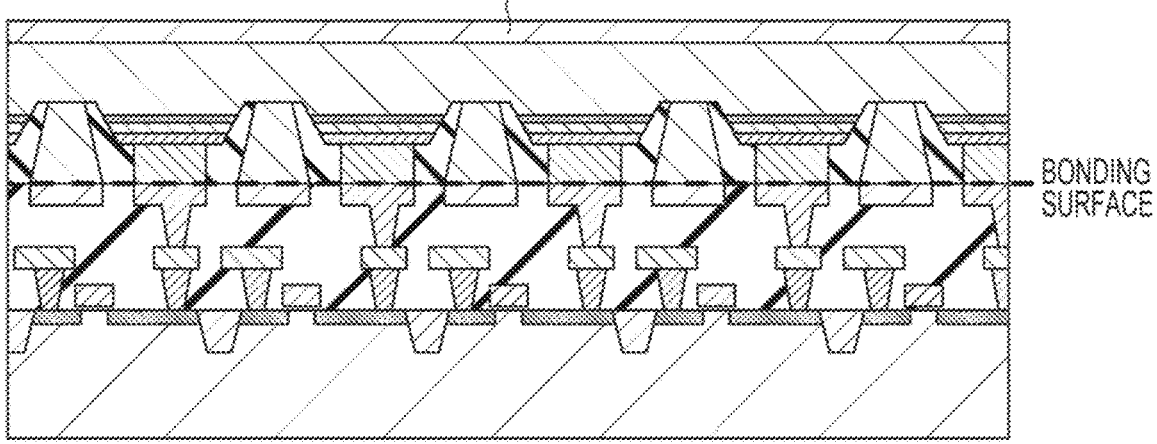

Next, as illustrated in FIG. 4C, the micro light emission element 100 and the drive circuit substrate 50 are stuck. At that time, the P-electrode 19P and the N-electrode 19N are precisely aligned so as to overlap with the corresponding P-drive electrode 51 and the N-drive electrode 52, respectively. The two wafers are stuck to each other by plasma cleaning of the surface or activation by ion irradiation or heating or pressure, in accordance with the material of the bonding surface.

Figure 4D:
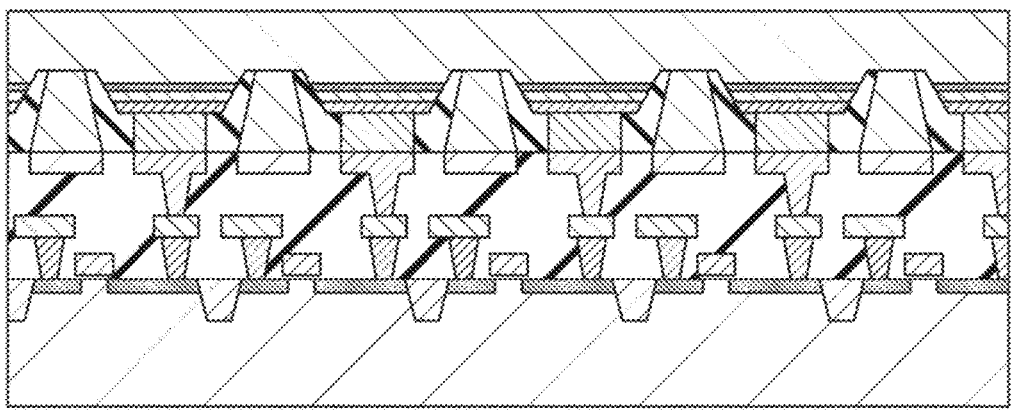

Then, as illustrated in FIG. 4D, the growth substrate 9 of the micro light emission element 100 is removed. For removal of the growth substrate 9, various skills such as grinding, polishing, plasma etching, wet etching, wet etching of a sacrificial layer, and laser lift-off can be used.

By the process described above, the micro light emission elements 100 configured with the compound semiconductor 14 are arranged on the drive circuit substrate 50 to complete the structure. In this state, the electrical coupling is completed between the micro light emission element 100 and the drive circuit of the drive circuit substrate 50, and an interconnection layer may not be provided on the light emitting surface.

Figure 5A:
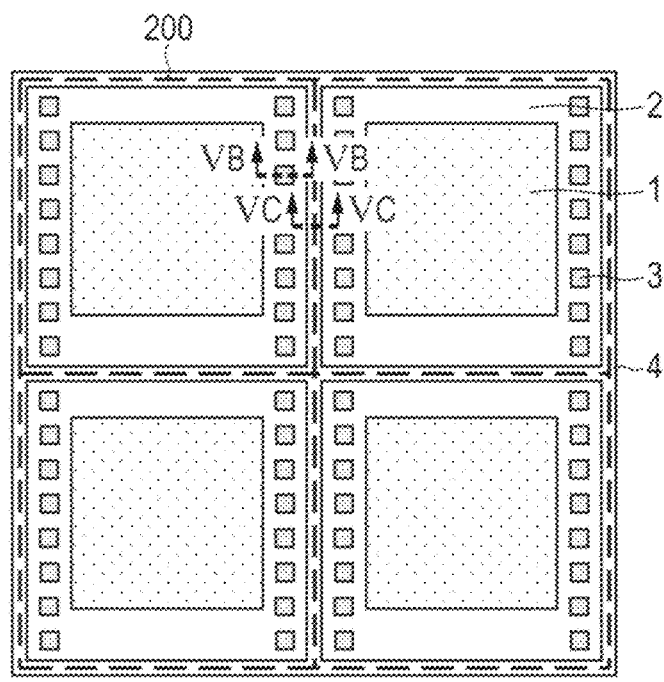
FIGS. 5A to 5C are top views of the image display device according to Embodiment 1 of the present disclosure.

Next, a plan view of the image display device 200 is illustrated in FIG. 5A. In the image display device 200, a pixel region 1 is a part that emits light and actually displays an image. The above description is mostly made on the pixel region 1.

In the image display device 200, other than the pixel region 1, there exist a dummy region 2 which is a region that does not emit light, a plurality of external coupling regions (I/O regions) 3, a scribe portion 4 which separates the image display device 200 individually. In the dummy region 2, circuits such as a row selection circuit, a column signal output circuit, an image processing circuit, and an input/output circuit other than the micro light emission element drive circuit are disposed on the drive circuit substrate 50.

In the configuration of the present embodiment, the compound semiconductor 14 is stuck on the drive circuit substrate 50 in all of these regions. Therefore, the surface on the light emitting surface side of the image display device 200 is planarized, and the process of forming a pattern for wavelength conversion by a phosphor or a quantum dot, a color filter, a micro lens or the like can be easily performed. Since it is desirable to maintain the coupling between the compound semiconductor 14 and the drive circuit substrate 50 even in the region other than the pixel region 1, in principle, it is desirable that the bonding surfaces of the compound semiconductor 14 side and the drive circuit substrate 50 side face each other with the same kind of materials.

In the dummy region 2, it is not desirable to provide a current path through the bonding surface, so the insulation layers can be made to face each other. That is, it is possible not to provide an electrode in the dummy region 2. In addition, when it is desirable to suppress a light incident on the drive circuit substrate 50 in order to avoid malfunction of the drive circuit substrate 50, the electrodes can be densely packed. Alternatively, the same structure as the micro light emission element 100 is formed in the dummy region 2 and used as an optical sensor. In such a case, the same structure as the pixel region 1 is disposed.

Figure 5B:
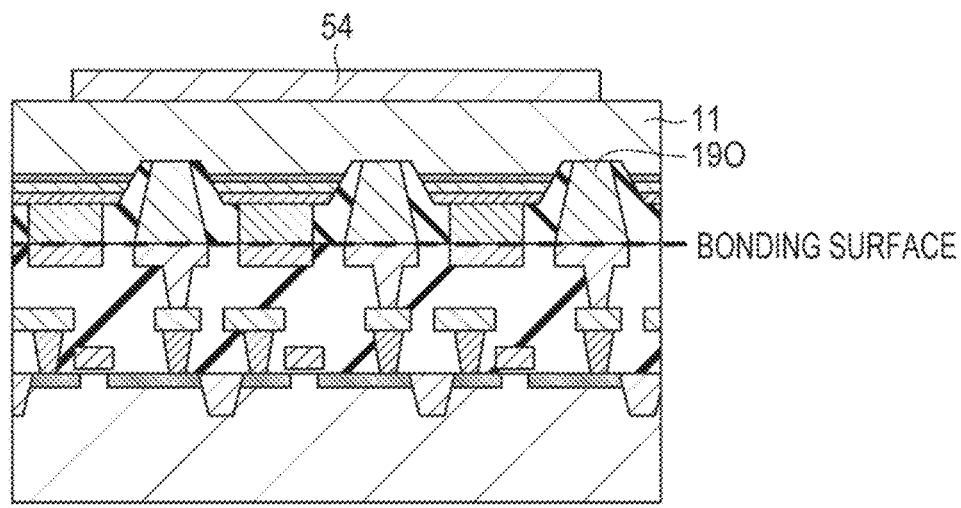

As illustrated in the sectional view of FIG. 5B, in the external coupling region 3, an external coupling portion 54 is provided on the light emitting surface side of the compound semiconductor 14. The external coupling portion 54 supplies an image signal, a control signal, a power source, or the like to the image display device 200. An example of the external coupling portion 54 is a wire bonding pad.

The external coupling portion 54 is coupled to a corresponding electrode on the drive circuit substrate 50 side through an external coupling electrode 19O formed simultaneously with the N-electrode 19N. The external coupling electrode 19O may have a plurality of thin pillars similar to the N-electrode 19N, or may be formed in a thick pillar shape. In the configuration of the present embodiment, the N-side layer 11 of the compound semiconductor 14 is present between the external coupling electrode 19O and the external coupling portion 54. When the increase in resistance due to the N-side layer 11 becomes a problem, in the external coupling region 3, it is also possible to etch the light emitting surface of the compound semiconductor 14 to expose the external coupling electrode 19O.

Figure 5C:
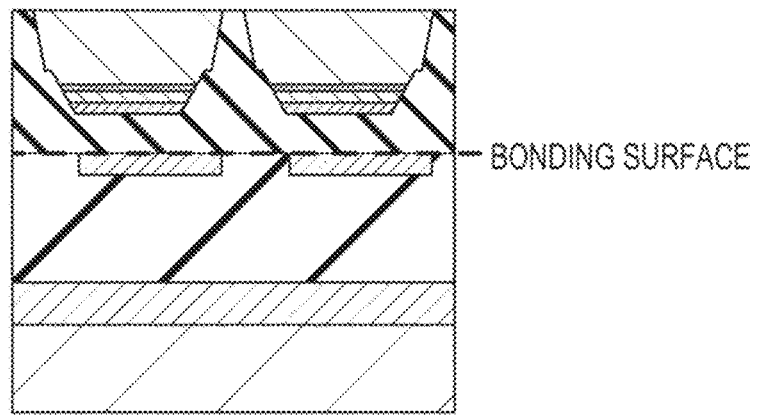

Next, as illustrated in the sectional view of FIG. 5C, in the scribe portion 4, an electrode pattern such as the P-drive electrode 51 or the N-drive electrode 52 is disposed on the drive circuit substrate 50 side, but the corresponding P-electrode or N-electrode is not disposed on the compound semiconductor 14 side. In this way, bonding force in the region can be weakened by disposing the electrode on one side and not disposing the electrode on the other side. In order to facilitate cutting at the scribe line (scribe portion 4), it may be desirable in some cases that the bonding between the drive circuit substrate 50 and the compound semiconductor 14 is weak. With respect to such a region of limited area, it is also possible to have a configuration in which an electrode is disposed on one side and an insulation layer is disposed on a surface of the corresponding other side.

The same configuration can be adopted not only for the scribe portion 4 but also for a region where the compound semiconductor 14 may be removed. Further, when a laser blown fuse is disposed on the drive circuit substrate 50, the electrode can be disposed on the drive circuit substrate 50 side without disposing the electrode on the compound semiconductor 14 side. [Modification Example of Embodiment 1]

Figure 6A:
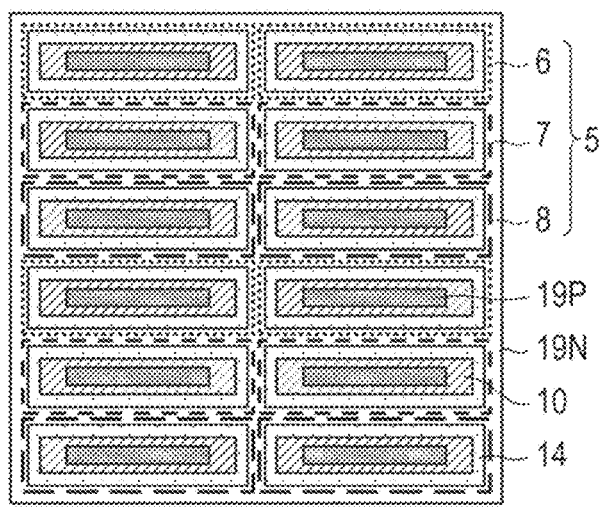
FIGS. 6A to 6D are schematic plan views of micro light emission elements according to Modification Example of Embodiment 1 of the present disclosure when viewed from the light emitting side.

In Embodiment 1, the micro light emission element 100 is of one type and is a monochrome display device. However, as illustrated in FIG. 6A, a pixel 5 can be configured with a blue sub-pixel 6, a red sub-pixel 7, and a green sub-pixel 8 to form a full color display device. Each sub-pixel has an individual micro light emission element. Each sub-pixel may be configured with a micro light emission element that emits blue light, red light, or green light, or may emit red light or green light by combining a micro light emission element that emits blue light with a wavelength conversion layer.

Figure 6B:
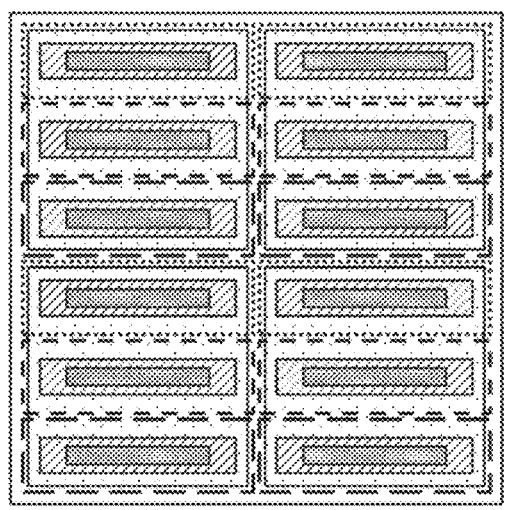

In FIG. 6A, an isolation trench 15 surrounds a periphery of each sub-pixel and N-electrodes 19N are disposed on all the isolation trenches 15. However, as illustrated in FIG. 6B, it is also possible that although the isolation trench 15 surrounds the periphery of each sub-pixel, the N-electrodes 19N is disposed so as to cover a periphery of the pixel 5. In this case, since it is not desirable to dispose the N-electrode 19N between the sub-pixels in the pixel 5, the isolation trench 15 between the sub-pixels can be narrowed. As a result, by enlarging the width of a mesa 16 of the sub-pixel, an area of the light emission layer 12 can be expanded, current density flowing into the light emission layer 12 can be reduced, and the light emission efficiency can be improved.

Figure 6C:
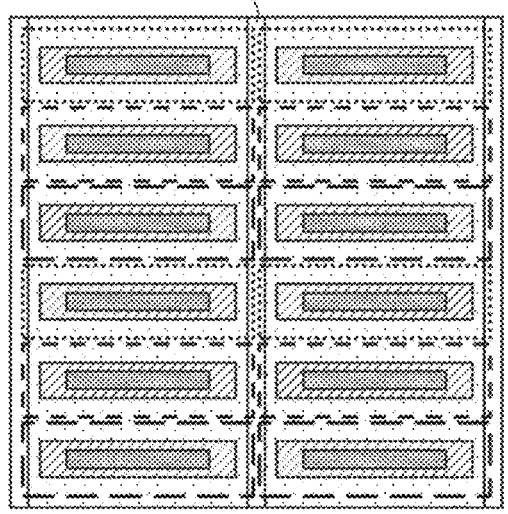
Figure 6D:
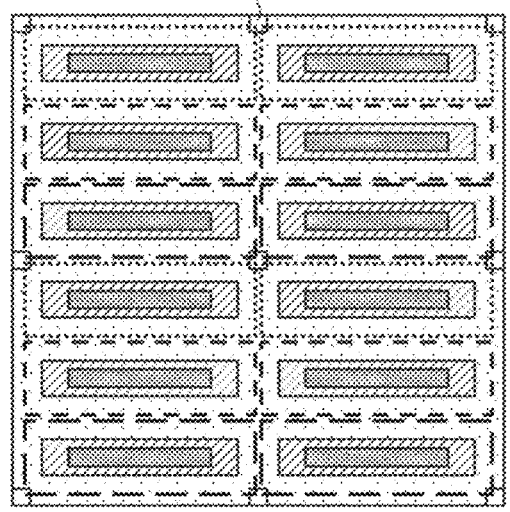
Figure 7A:
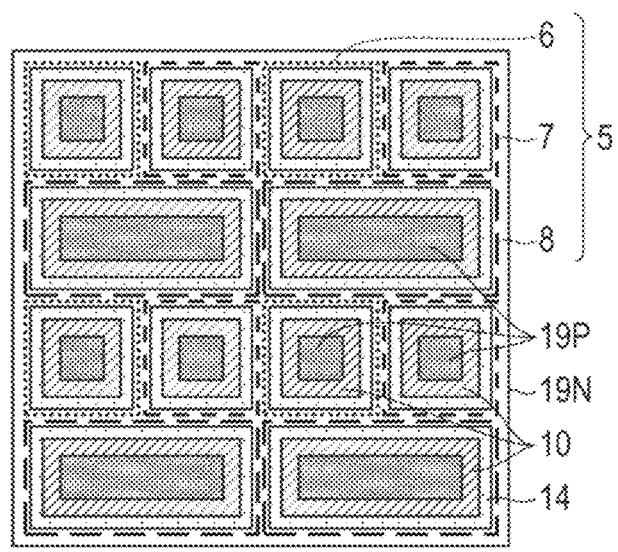
FIGS. 7A to 7C are a schematic plan views of the micro light emission elements according to Modification Example of Embodiment 1 of the present disclosure when viewed from the light emitting side.

Furthermore, as illustrated in FIG. 6C, the N-electrode 19N can be disposed only in one direction of a boundary of the pixel 5, or as illustrated in FIG. 6D the N-electrode 19N can also be disposed in a dot shape at the four corners of the pixel 5. All have the same effect as FIG. 6B, and as the amount of disposition of the N-electrode 19N decreases, the effect of improving the light emission efficiency becomes larger. In this way, although the N-electrode 19N is disposed on the isolation trench 15, it does not necessarily have to be disposed on the entire region of the isolation trench 15. In order to make light output variations uniform among the pixels 5, it is desirable that the N-electrode 19N is provided for at least each pixel 5 since it is desirable that the interconnection resistance be uniform among the pixels 5. Therefore, as illustrated in FIG. 6D, the configuration in which the N-electrodes 19N are disposed at the four corners of the pixel 5 is most desirable. The shape of the sub-pixel is not limited to the shape illustrated in FIG. 6A, and may be, for example, the shape illustrated in FIG. 7A.

Figure 7B:
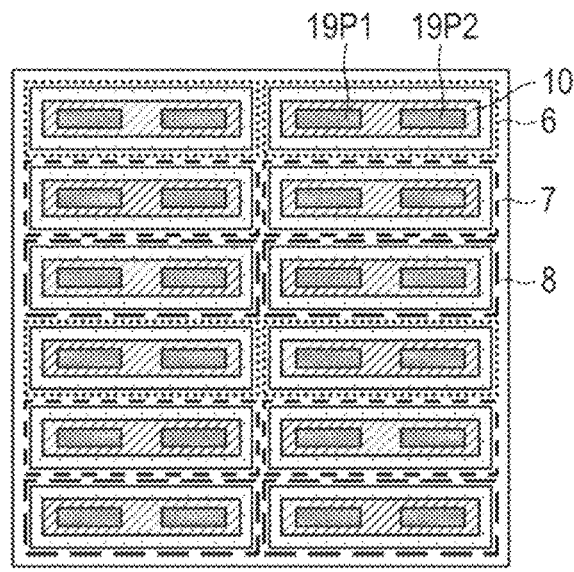

In the above examples, one P-electrode 19P is disposed to the micro light emission element 100, but the number is not limited to one. For example, as illustrated in FIG. 7B, two of a P-electrode 1 19P1 and a P-electrode 2 19P2 may be disposed. By providing the P-electrode 1 19P1 and the P-electrode 2 19P2, it is possible to realize a redundant function in which when one of the two causes a conduction defect, the other one is substituted. Note that, here, the redundant function means that a spare device is disposed as a backup and a failure device is replaced by the spare device so as to maintain the function of the entire system even when a failure occurs.

Figure 7C:
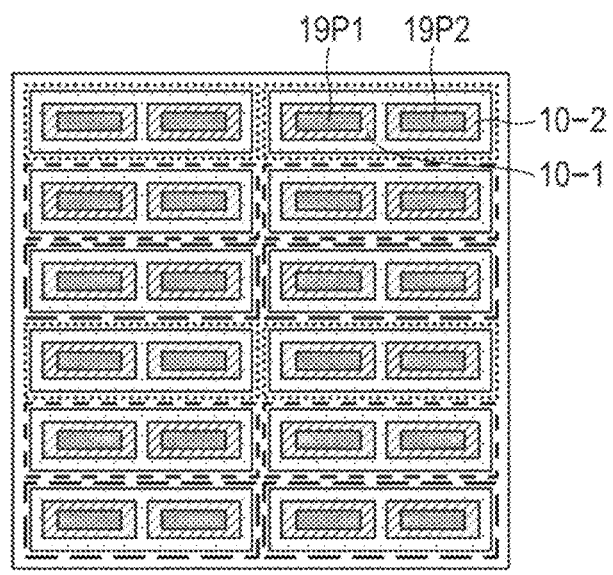

Further, as illustrated in FIG. 7C, the P-electrode layer is also divided into a P-electrode layer 1 10-1 and a P-electrode layer 1 10-2, so that the micro light emission element 100 can be actually divided into two. When the P-electrode 1 19P1 becomes defective, by using the P-electrode 2 19P2, the redundant function can be realized not only for the conduction defect of the electrode but also for the micro light emission element 100.

In order to realize the redundant function, it is desirable to store the presence/absence of a defect for each micro light emission element 100 on the drive circuit substrate 50 side and have a function to select a normal P-electrode when the operation is being performed. Although it causes cost increase, generally, the cost reduction effect by the yield improvement by redundancy is larger, and such redundancy function is effective.

Note that in this case, since the pattern of the P-electrode layer 10 and the pattern of the mesa 16 are different, the number of processes of photolithography may be increased by one. However, it is possible to determine whether to take the additional process or not, by considering which is large between cost up due to the process increase and cost down due to the yield improvement by using the redundant function. As described above, although the P-electrode is disposed on the mesa 16 having the light emission layer 12, it is not necessarily limited to one, and a plurality of P-electrodes may be disposed.

Embodiment 2

The present embodiment differs from Embodiment 1 in that a separation trench 20 for separating the micro light emission elements 100a is added. The separation trench 20 covers the periphery of the micro light emission element 100a to inhibit leakage of light from the micro light emission element 100a to adjacent micro light emission elements, thereby a decrease in contrast can be inhibited.

Figure 8A:
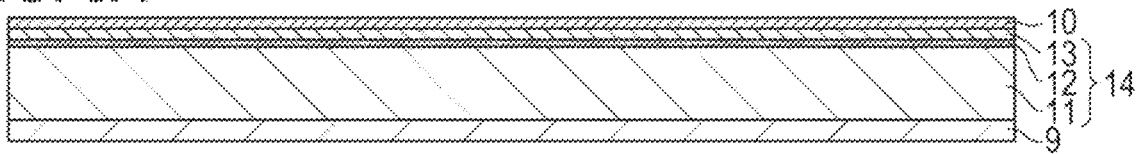
FIGS. 8A to 8F are schematic sectional views illustrating a manufacturing process of a micro light emission element according to Embodiment 2 of the present disclosure.
Figure 8B:
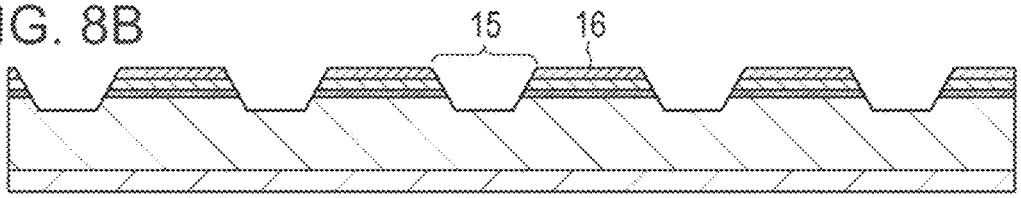
Figure 8C:
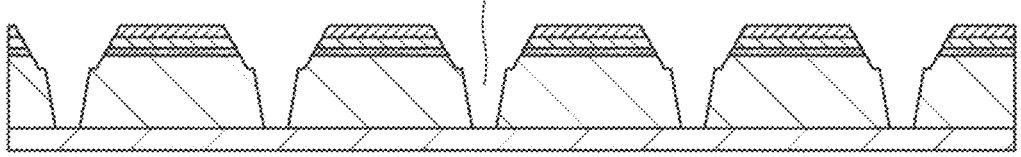

Next, the manufacturing process of the micro light emission element 100a will be described with reference to FIGS. 8A to 8F. FIGS. 8A and 8B are the same as FIGS. 3A and 3B, respectively. Next, as illustrated in FIG. 8C, the separation trench 20 is formed at the bottom portion of the isolation trench 15. Thereby, each micro light emission element 100a is separated.

Figure 8D:
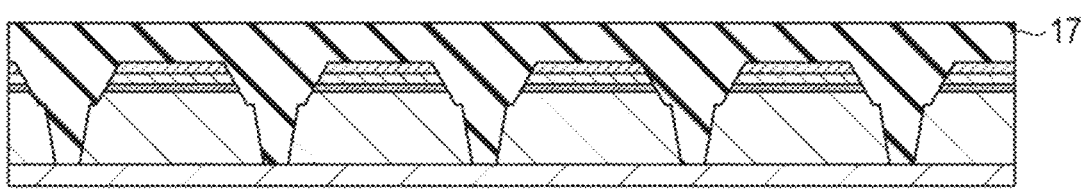
Figure 8E:
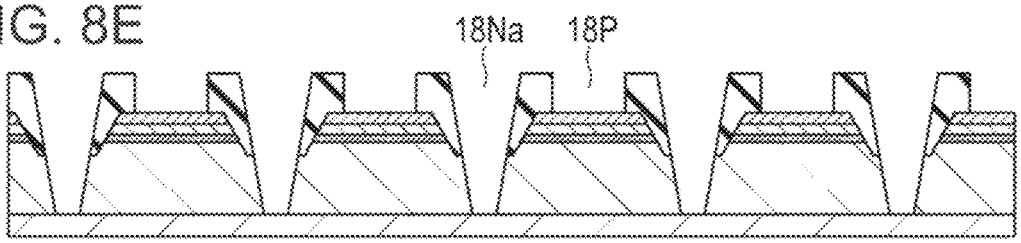
Figure 8F:
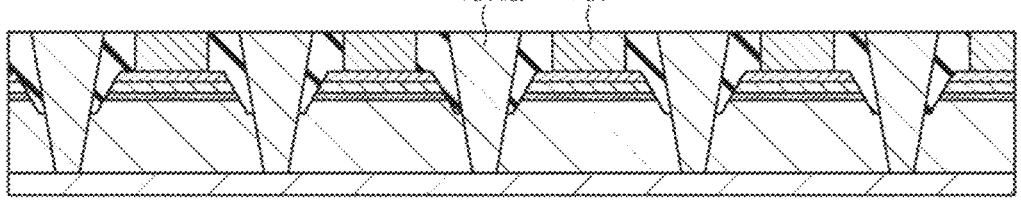

Next, as illustrated in FIG. 8D, the isolation trench 15 and the separation trench 20 are filled with a protection layer 17, and a surface is planarized by CMP. Next, as in FIGS. 3D and 3E, the P-groove 18P and the N-groove 18Na are formed, and the P-electrode 19P and the N-electrode 19Na are formed by using the Damascene method. In FIG. 8F, the coupling between the N-electrode 19Na and the N-side layer 11 is performed on a side wall of the N-side layer 11 formed when the separation trench 20 is formed, but the coupling method is not limited thereto. For example, when forming the separation trench 20, the bottom portion of the isolation trench 15 may be coupled to the N-electrode 19Na without increasing the number of processes by leaving the bottom portion of the isolation trench 15 in the micro light emission element 100a and forming the N-groove 18Na in that portion.

Figure 9:
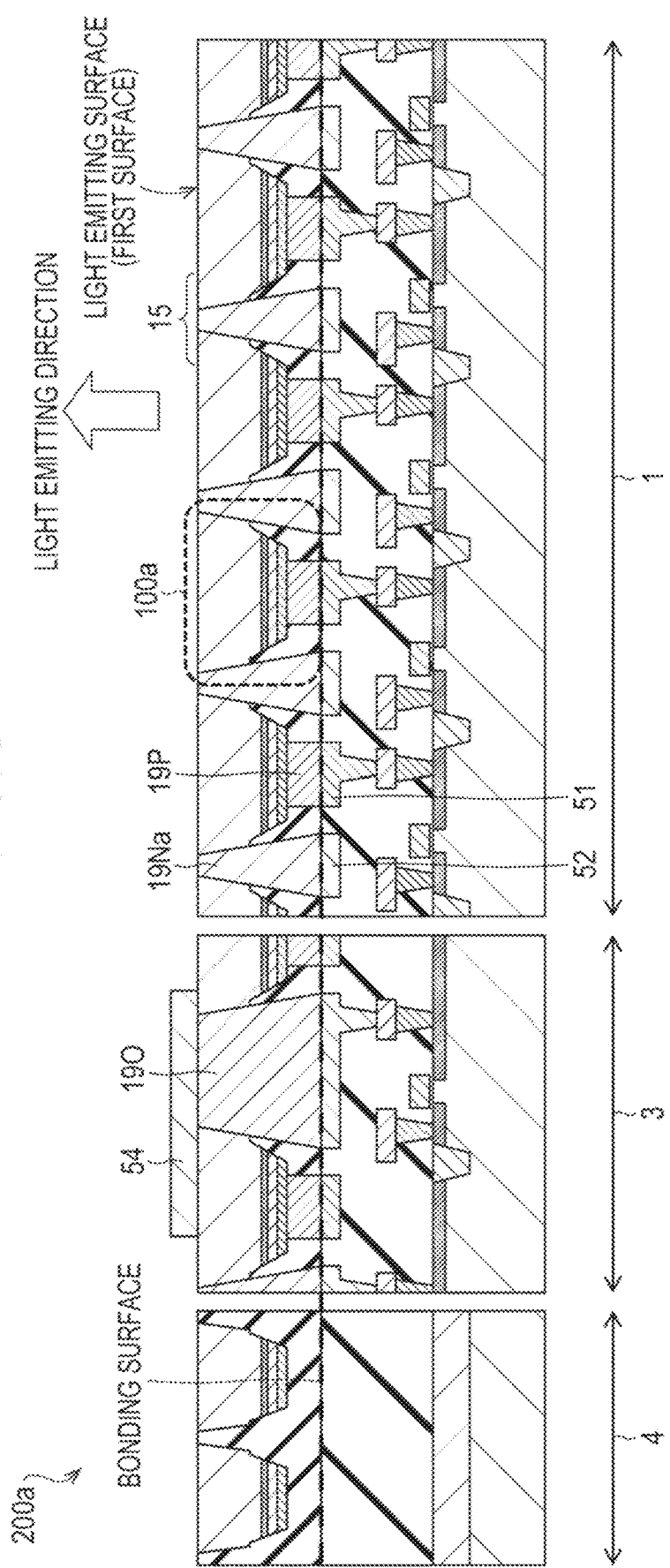
FIG. 9 is a schematic sectional view illustrating a structure of an image display device according to Embodiment 2 of the present disclosure.

The process of forming an image display device 200a by bonding a wafer on which the micro light emission element 100a is formed and a wafer on which the drive circuit substrate 50 is formed, is the same as the process of Embodiment 1. A sectional view of the image display device 200a formed in this manner is illustrated in FIG. 9. In FIG. 9, other than the pixel region 1 in which the micro light emission element 100a emitting light is present, a sectional view is also illustrated for the external coupling region 3 and the scribe portion 4.

Also in the present embodiment, as in Embodiment 1, the P-electrode 19P and the N-electrode 19Na of the micro light emission element 100a are configured with the same interconnection layer, and have a simple configuration having only one interconnection layer, thereby it can be manufactured by a simple manufacturing process.

Furthermore, regarding the pixel region 1, the metal material forming the N-electrode covers the periphery of the micro light emission element 100a. That is, sidewalls of the micro light emission element 100a are covered by the metal material as shown in FIG. 8F and FIG. 9. Thereby, light emitted from the micro light emission element 100a can be inhibited from leaking to the adjacent micro light emission elements 100a, and the contrast can be enhanced. The other points are similar to those of Embodiment 1, and as in Embodiment 1, since a current path between the micro light emission element 100a and the drive circuit substrate 50 is completed at the time of bonding, an interconnection may not be formed on a light emitting surface after the bonding.

As a result, it is possible to inhibit a decrease in light emission efficiency due to light absorption caused by the interconnection of the light emitting surface, and possible to simplify the manufacturing process of the image display device 200a. In addition, since it can be coupled to the drive circuit in units of the micro light emission elements, the problem that interconnection resistance is different for each micro light emission element 100a does not occur. In addition, regarding the manufacturing process, a wafer on which a plurality of drive circuits of the image display device 200a are disposed, and a wafer on which a large number of micro light emission elements 100a are disposed, are stuck to each other thereby a large number of image display devices 200a can be manufactured at a time, and since the bonding is performed at a wafer level, a generation of dust is reduced and high yield can be realized.

As illustrated in the external coupling region 3 in FIG. 9, in the configuration of the present embodiment, the N-electrode 19N reaches the light emitting surface of the compound semiconductor 14. Therefore, the external coupling electrode 19O formed simultaneously can be exposed on the light emitting surface of the compound semiconductor 14.

As illustrated in FIG. 9, the external coupling electrode 19O may have a thick pillar shape, or may have a large number of thin pillars arranged, and can be formed in the same process as the N-electrode 19Na. By providing the external coupling portion 54 on the external coupling electrode 19O, an input/output portion of the image display device 200a can be formed. The external coupling portion 54 may be, for example, a pad for wire bonding or a gold bump. As described above, according to the configuration of the present embodiment, a low resistance external coupling portion 54 can be easily disposed.

In the scribe portion 4 in FIG. 9, unlike Embodiment 1, the metal electrode is not disposed on the drive circuit substrate 50 side nor on the compound semiconductor 14 side. This is because, when the image display devices 200 are separated from each other by laser dicing, it is desirable to have no metal electrode. It is also possible to combine such a scribe portion 4 with Embodiment 1.

Embodiment 3

Figure 10A:
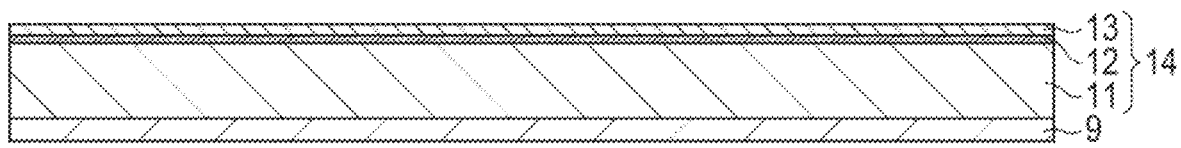
FIGS. 10A to 10E are schematic sectional views illustrating a manufacturing process of a micro light emission element according to Embodiment 3 of the present disclosure.
Figure 10B:
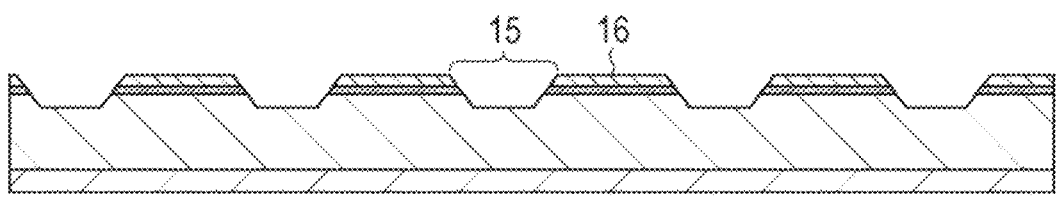
Figure 10C:
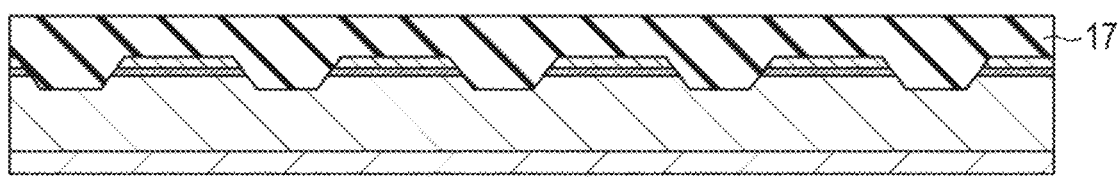

The present embodiment is similar to Embodiment 2 in that a micro light emission element 100b is surrounded by a metal material, but the configuration of the metal material is different. FIGS. 10A to 10E illustrate a manufacturing process of the micro light emission element 100b. FIGS. 10A to 10C are similar to FIGS. 3A to 3C, respectively. However, the P-electrode layer 10 is omitted.

Figure 10D:
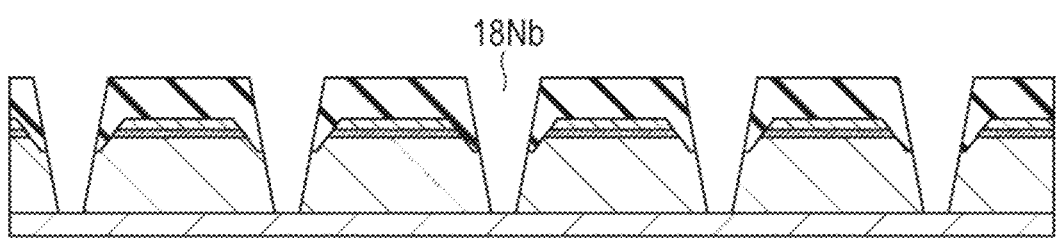

In FIG. 10D, the protection layer 17 is etched and then the N-side layer 11 is etched to form an N-groove 18Nb. Thereafter, as illustrated in FIG. 10E, an N-side contact electrode 21 is formed in a lower portion of the N-groove 18Nb.

The N-side contact electrode 21 is desirably made of a metal material having a high reflectance, such as aluminum, when in contact with the N-side layer 11. The electrode used for the bonding is generally made of a material such as gold, copper, nickel, or the like. When such a material is in contact with, for example, a nitride semiconductor, a light reflectance at a boundary surface is about 40% to 60%, and about half of the light is absorbed by the metal material. In contrast to this, materials such as aluminum or silver have a reflectance of about 80% or more and have relatively low light absorption. Therefore, as compared with Embodiment 2, the configuration of the present embodiment can improve the light output.

Figure 10E:
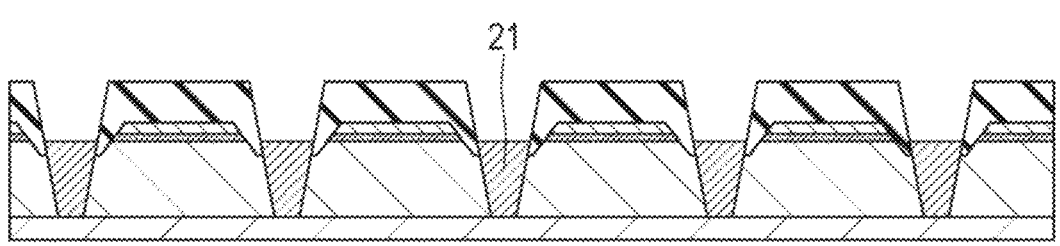

A structure in which a lower portion of the N-groove 18Nb is filled with a metal material and an upper portion is opened as illustrated in FIG. 10E can be formed, for example, by filling the portion with the metal material using a flow sputtering method or a CVD method, and by dry etching back the surface.

Figure 11A:
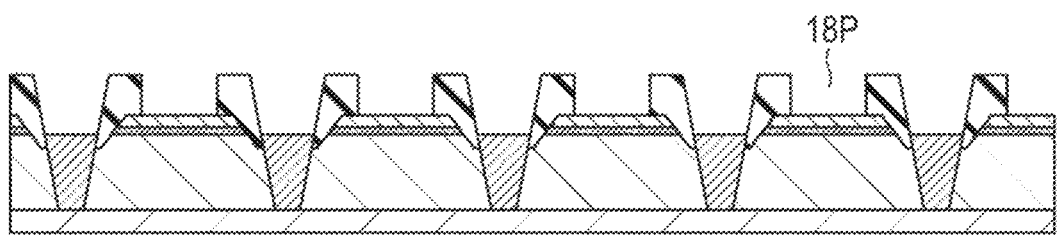
FIGS. 11A and 11B are schematic sectional views illustrating a manufacturing process of the micro light emission element according to Embodiment 3 of the present disclosure.
Figure 11B:
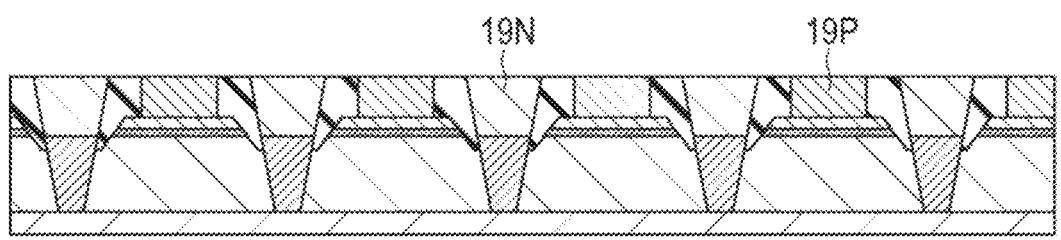

Next, as illustrated in FIG. 11A, a P-groove 18P is formed, and further, as illustrated in FIG. 11B, the P-electrode 19P and the N-electrode 19N are formed. The main materials of the P-electrode 19P and the N-electrode 19N are the same as those in Embodiment 1 and Embodiment 2, but in the present embodiment, the metal layer of the lowermost portion is changed to directly couple to the P-side layer 13. For example, in a nitride semiconductor, it is desirable to dispose palladium (Pd) and dispose a barrier metal layer thereon. As described above, in the configuration of the present embodiment, since the N-side contact electrode 21 coupled to the N-side layer 11 is provided, the P-electrode layer 10 is omitted to reduce the number of processes, but the P-electrode layer 10 may not necessarily be omitted.

As described above, the P-electrode 19P is disposed on the mesa 16, the N-electrode 19N is disposed on the isolation trench 15, and both the P-electrode 19P and the N-electrode 19N are disposed on surfaces to be the bonding surface, and the surfaces are configured to be planarized with the same material. The N-electrode 19N is configured with two layers made of different materials, and on a side in contact with the N-side layer 11 of the light emitting surface side, a material with high light reflectance is disposed.

Using the micro light emission element 100b, an image display device 200b can be configured as in Embodiment 2. Thus, the effect similar to Embodiment 2 is realizable. Further, the N-electrode 19N is configured with two layers made of different materials, and a material having a high light reflectance is disposed on a side in contact with the N-side layer 11 of the light emitting surface side, thereby the light output can be improved as compared with Embodiment 2.

Embodiment 4

The present embodiment is different in that a micro light emission element 100c is a vertical cavity surface emitting laser (VCSEL) type micro laser element. Compared to the micro LED element, a spectrum of light emitting wavelength is narrow, and display with high directivity is possible.

An example of a manufacturing method of the micro light emission element 100c will be described below with reference to FIGS. 12A to 12E. FIGS. 12A to 12E are sectional views illustrating a manufacturing process of the micro light emission element 100c.

Figure 12A:
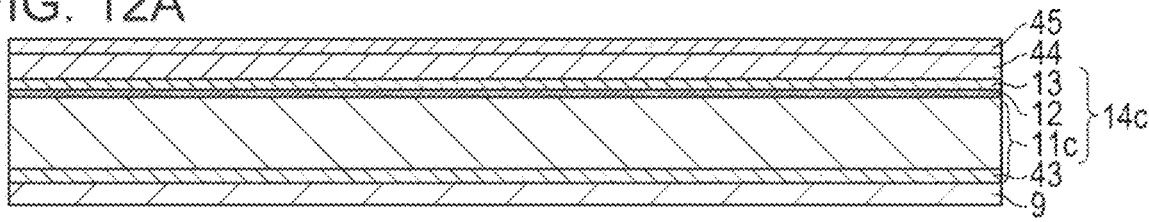
FIGS. 12A to 12E are schematic sectional views illustrating a manufacturing process of the micro light emission element according to Embodiment 4 of the present disclosure.

As illustrated in FIG. 12A, a first reflection layer 43, an N-side layer 11c, the light emission layer 12 and the P-side layer 13 are sequentially deposited on the growth substrate 9 to form a compound semiconductor 14c.

The first reflection layer 43 is a distributed Bragg reflector (DBR) that reflects light of an laser emission wavelength. When emitting blue light using a nitride semiconductor, the first reflection layer 43 can be formed by stacking a plurality of pairs of $Al_xGa_{(1-x)}N$ layers and GaN layers. For example, the first reflection layer 43 includes 20 layers of GaN/AlGaN pairs in which a thickness of the GaN layer is 46 nm, a thickness of the $Al_xGa_{(1-x)}N$ layer is 47 nm, and a total thickness of GaN/AlGaN pair is 93 nm, and has the total thickness of about 1.8 µm.

The transparent conductive electrode layer 44 and a second reflection layer 45 are further deposited on the compound semiconductor 14c. The transparent conductive electrode layer 44 is an electrode layer of indium, tin, oxide (ITO), or the like, and has a thickness of about 50 nm to 600 nm. The second reflection layer 45 is a DBR configured with a dielectric multilayer film. For example, the second reflection layer 45 includes 10 layers of pairs of a $TiO_2$ thin film (thickness is 36 nm) and a $SiO_2$ thin film (thickness is 77 nm), and has the total thickness of about 1.1 µm. The reflectance of the second reflection layer 45 to blue light is higher than the reflectance of the first reflective layer 43.

Figure 12B:
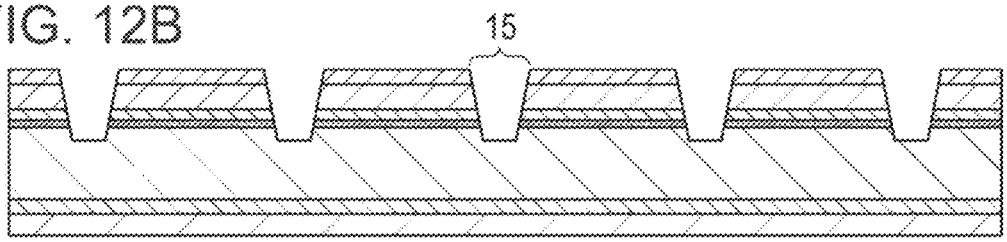

As illustrated in FIG. 12B, after the second reflection layer 45 is laminated, the isolation trenches 15 are formed by a photolithography technique and a dry etching technique. The isolation trench 15 is formed by etching a part of a second reflection layer 45, a part of a transparent conductive electrode layer 44, a part of the P-side layer 13, a part of the light emission layer 12, and a part of the N-side layer 11. It is not desirable to incline the side surface of the isolation trench 15 largely, as in Embodiment 1. This is because, with the laser element, the isolation trench does not emit light in a horizontal direction, thereby a reflection in a vertical direction is not compulsory.

Figure 12C:
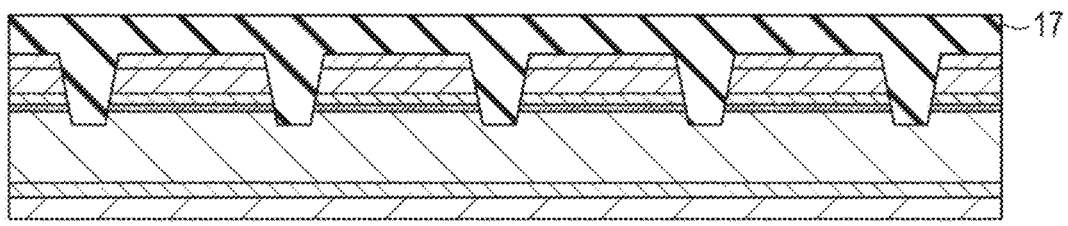
Figure 12D:
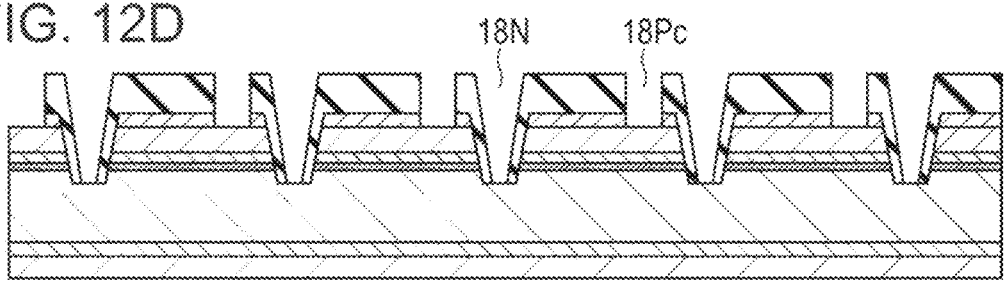

Next, as illustrated in FIG. 12C, the isolation trenches 15 are filled with a protection layer 17, and the surface is planarized. Further, as illustrated in FIG. 12D, an N-groove 18N and a P-groove 18Pc are formed. The N-groove 18N reaches the N-side layer 11c at the bottom portion of the isolation trench 15 by etching the protection layer 17. The P-groove 18Pc reaches the transparent conductive electrode layer 44 by etching the protection layer 17 and the second reflection layer 45.

Figure 12E:
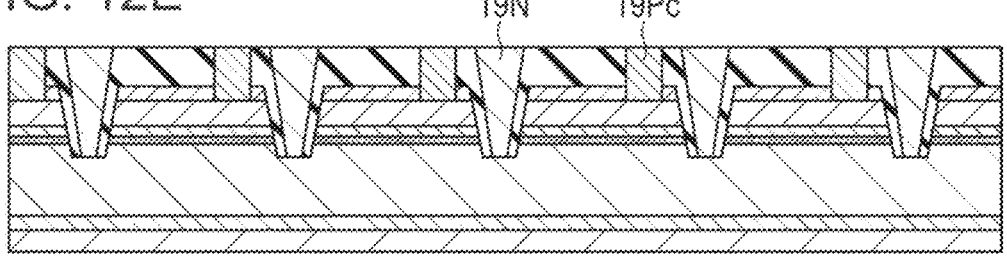

Next, as illustrated in FIG. 12E, the P-electrode 19Pc and the N-electrode 19N are formed. Here, although the P-electrode 19Pc is formed on the light emission layer, it is desirable that the P-electrode 19Pc be disposed not on the center but on the outer peripheral portion with respect to the region where the light emission layer 12 exists. This is because the P-electrode 19Pc penetrates the second reflection layer 45 thereby the light emission of the laser element is inhibited.

As described above, the P-electrode 19Pc is disposed on the light emission layer 12, the N-electrode 19N is disposed on the isolation trench 15, and both the P-electrode 19Pc and the N-electrode 19N are formed in a single interconnection layer and disposed on surfaces to be the bonding surface, and the surfaces are configured to be planarized with the same material. Using the micro light emission element 100c, an image display device 200c can be configured as in Embodiment 1. Thus, the effect similar to Embodiment 1 is realizable. Furthermore, in the present embodiment, compared with Embodiment 1, the spectral width of the light emitting wavelength can be narrowed, and the directivity can be increased.

Embodiment 5

The present embodiment is different from Embodiment 2 in that a micro light emission element 100d is not completely separated by the separation trench 20, and the metal layer does not directly cover the side wall of the N-side layer of the micro light emission element 100d.

Figure 13A:
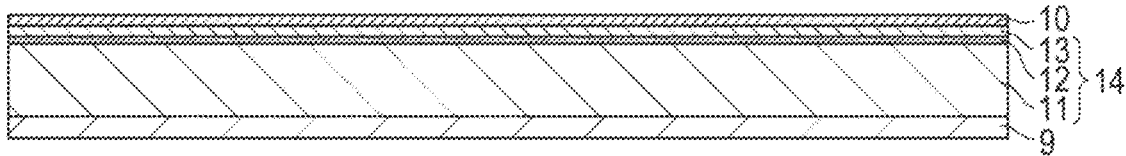
FIGS. 13A to 13F are schematic sectional views illustrating a manufacturing process of the micro light emission element according to Embodiment 5 of the present disclosure.
Figure 13B:
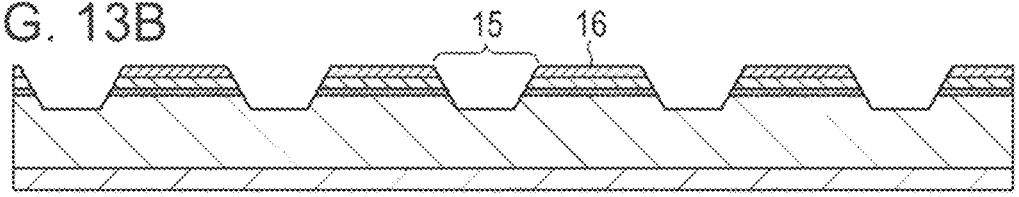

The manufacturing process of the micro light emission element 100d will be described with reference to FIG. 13A to FIG. 14C. FIGS. 13A and 13B are the same as FIGS. 8A and 8B in Embodiment 2, respectively.

Next, the separation trench 20 is formed, but it is different from FIG. 8C. Instead of completely separating the micro light emission element, a residual N-portion 22 remains in a part. A plan view of this state is illustrated in FIG. 14A, and the residual N-portion 22 is disposed between two among the four corners of the micro light emission element 100d configuring each sub-pixel.

Figure 13C:
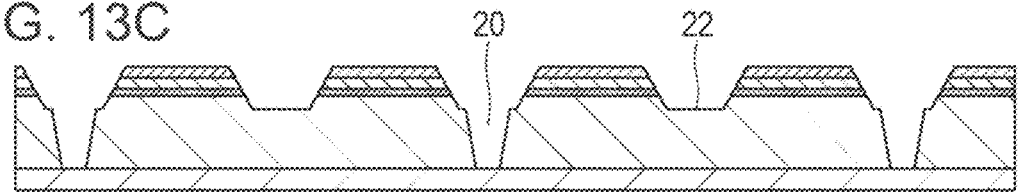
Figure 14A:
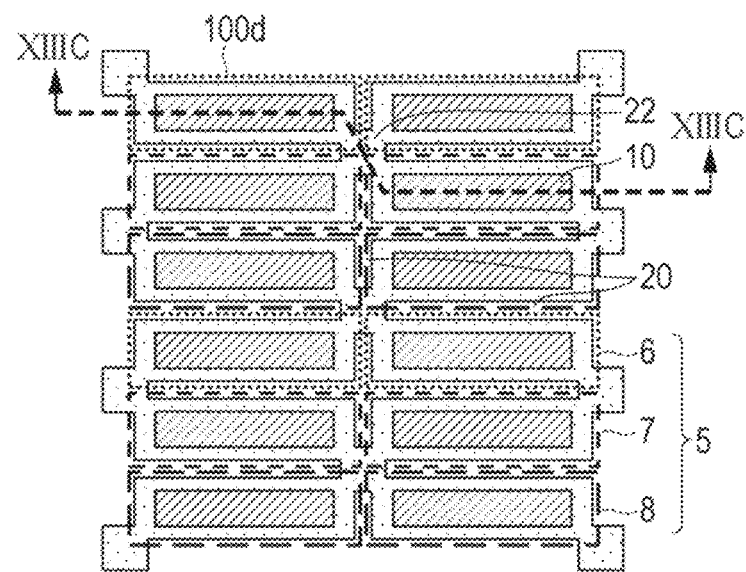
FIGS. 14A to 14C are top views of the micro light emission elements according to Embodiment 5 of the present disclosure.

Note that a sectional view taken along line XIIIC-XIIIC part in FIG. 14A is illustrated in FIG. 13C. The residual N-portion 22 is a portion where the N-side layer 11 and the N-electrode 19N are coupled, and the disposition thereof may not be limited to the location of FIG. 14A and may be the center of a side of the micro light emission element 100d.

Figure 13D:
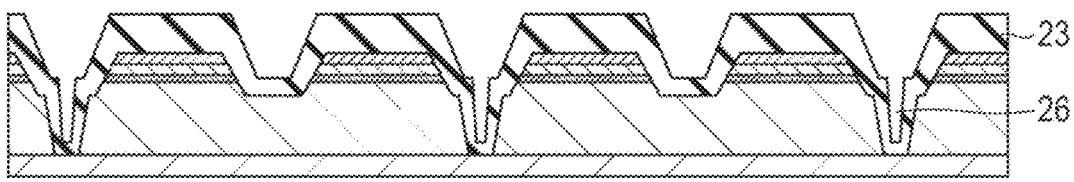

Next, as illustrated in FIG. 13D, a protection layer 23 is deposited on the entire surface. In this process, it is desirable to select the width of the separation trench 20 and the thickness of the protection layer 23 so that the separation trench 20 is not completely filled and the trench is left unfilled, like the gap 26. This process is a simple process without the need for planarization by CMP. The protection layer 23 is an insulation layer of the same type as the protection layer 17. It is desirable that the protection layer 23 is a transparent insulation layer.

Figure 13E:
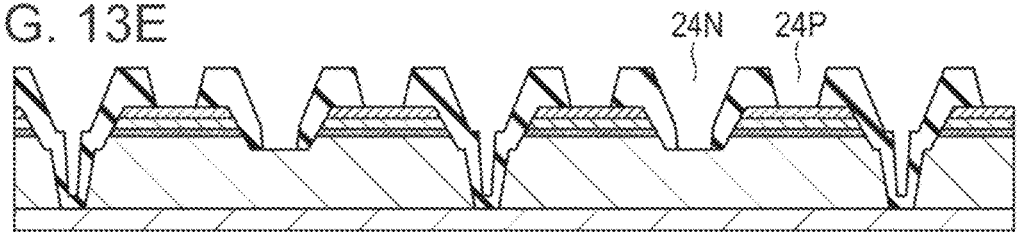
Figure 14B:
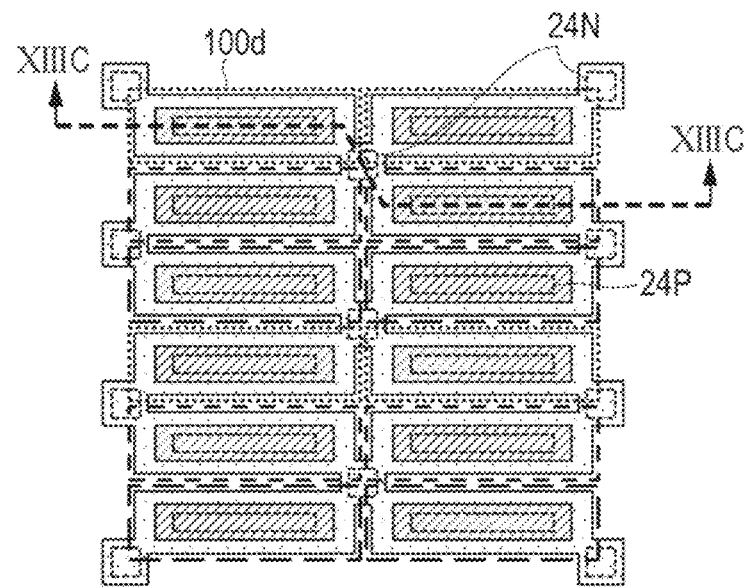

Next, as illustrated in FIG. 13E, a P-contact hole 24P and an N-contact hole 24N are formed in the protection layer 23. The P-contact hole 24P is disposed on the P-electrode layer 10, and the N-contact hole 24N is disposed on the residual N-portion 22. The disposition of the contact holes is illustrated in FIG. 14B.

Figure 13F:
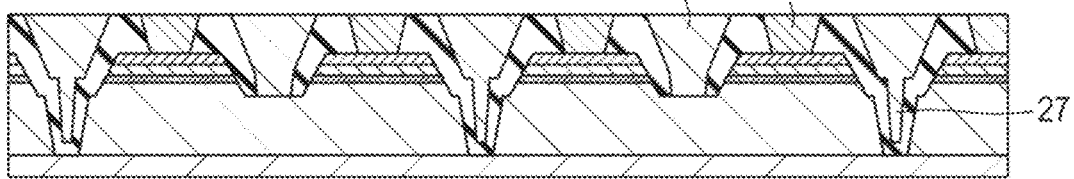
Figure 14C:
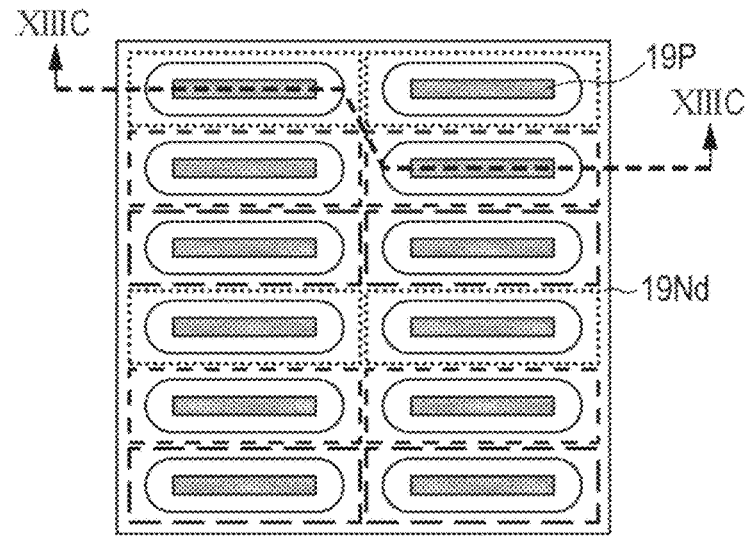

Next, as illustrated in FIG. 13F, a metal material is deposited, and a surface is dry etched back or polished by CMP, then the metal material is left in a recessed portion, thereby the P-electrode 19P is formed in the P-contact hole 24P. Further, an N-electrode 19Nd is formed in the N-contact hole 24N and between the micro light emission elements 100d. Furthermore, the metal material filling a gap 26 portion becomes the reflective light shielding portion 27. That is, in the micro light emission element 100d, the side wall of the N-side layer 11 and the side wall of the mesa 16 are covered with the protection layer 23, and a reflective metal material is disposed outside the protection layer 23 to shield the micro light emission elements from outgoing and incoming light. A plan view of this state is illustrated in FIG. 14C.

Also in the present embodiment, as in Embodiment 2, the P-electrode 19P and the N-electrode 19Nd of the micro light emission element 100d are configured with the same interconnection layer, and have a simple configuration having only one interconnection layer, thereby it can be manufactured by a simple manufacturing process.

Using the micro light emission element 100d, an image display device 200d can be configured as in Embodiment 2. In the configuration of the present embodiment, the micro light emission element 100d is partially coupled to the micro light emission element via the residual N-portion 22. However, since the coupling portion is very small and the other part is covered by the light shielding portion 27, light leakage is reduced and a decrease in contrast can be significantly suppressed.

Furthermore, in the configuration of the present embodiment, the interconnection layer is not exposed to the light emitting surface. The metal material which becomes the light shielding portion 27 is covered with the protection layer 23. In this structure, when the growth substrate 9 is peeled off, tolerance to an acid or an alkaline agent is greatly improved, so that the growth substrate 9 can be easily peeled off, and productivity can be improved. In addition, when forming an external coupling portion 54 after peeling off the growth substrate 9, the coupling resistance between the metal material and the external coupling portion 54 can be reduced by etching the protection layer 23 present at a boundary surface with the growth substrate 9.

Embodiment 6

Figure 15A:
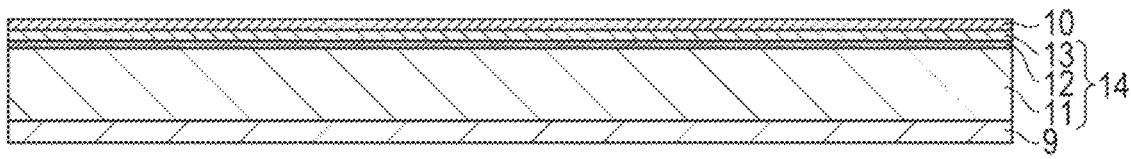
FIGS. 15A to 15F are schematic sectional views illustrating a manufacturing process of the micro light emission element according to Embodiment 6 of the present disclosure.
Figure 15B:
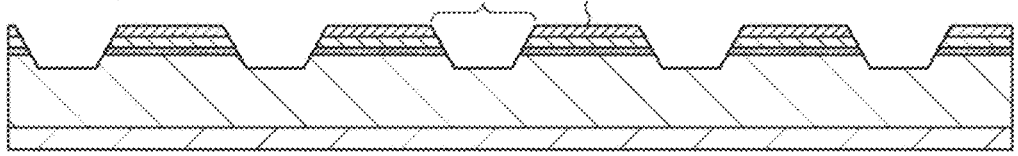

The present embodiment has a configuration in which Embodiment 5 and Embodiment 3 are combined. Next, the manufacturing process of the micro light emission element 100e will be described with reference to FIG. 15A to FIG. 17B. FIGS. 15A and 15B are the same as FIGS. 8A and 8B in Embodiment 2, respectively.

Figure 15C:
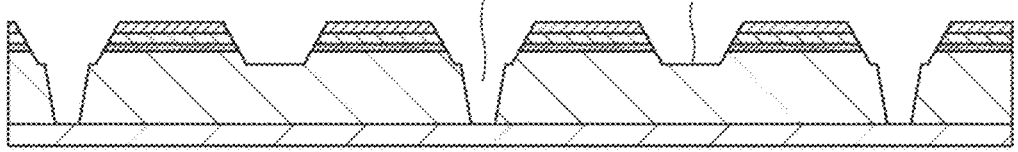
Figure 17A:
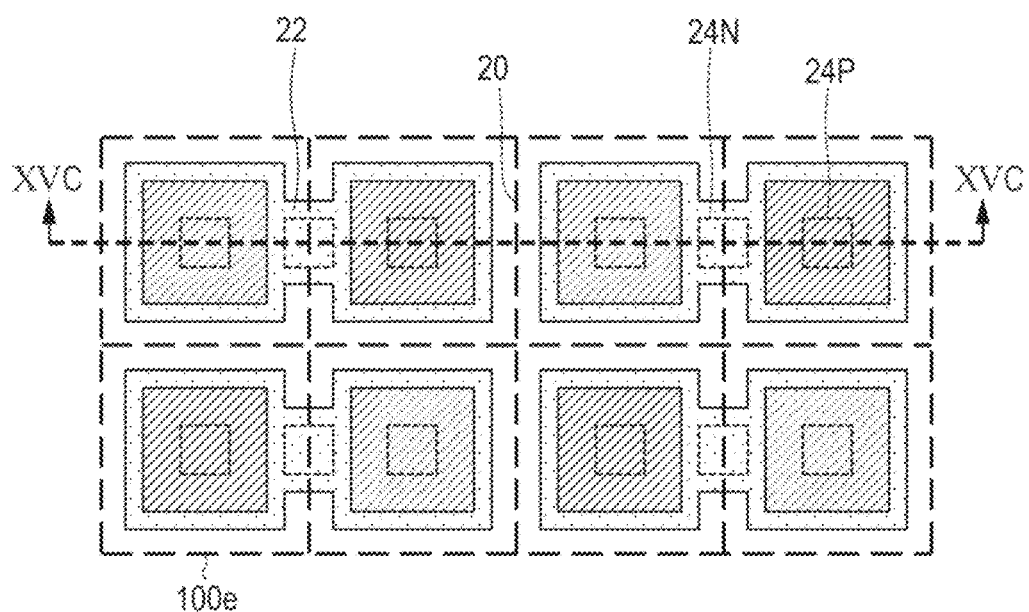
FIGS. 17A and 17B are schematic surface views illustrating a manufacturing process of the micro light emission element according to Embodiment 6 of the present disclosure.

Next, the separation trench 20 is formed, but it is different from FIG. 8C. Instead of completely separating the micro light emission element, a residual N-portion 22 remains in a part. A plan view of this state is illustrated in FIG. 17A, and a residual N-portion 22 is disposed between two adjacent micro light emission elements 100e. Note that a sectional view taken along line XVC-XVC part in FIG. 17A is illustrated in FIG. 15C. The residual N-portion 22 is a portion where the N-side layer 11 and the N-electrode 19N are coupled, and the disposition thereof may not be limited to the location in FIG. 17A and may be a corner of the micro light emission element 100e.

Figure 15D:
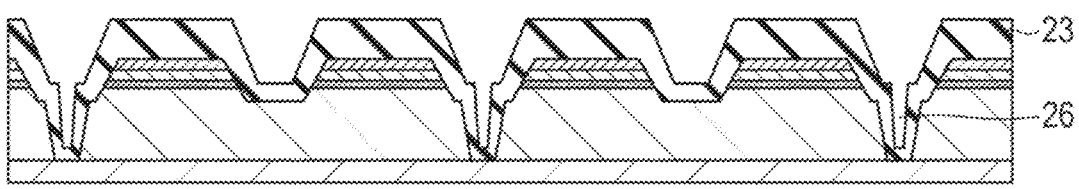

Next, as illustrated in FIG. 15D, a protection layer 23 is deposited on the entire surface. In this process, it is desirable to select the width of the separation trench 20 and the thickness of the protection layer 23 so that the separation trench 20 is not completely filled and the trench is left unfilled, like the gap 26. This process is a simple process without the need for planarization by CMP.

Figure 15E:
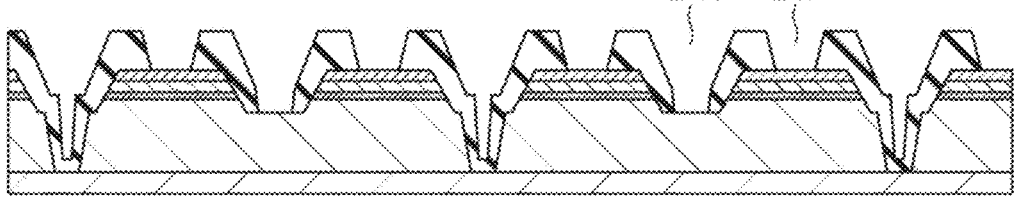

Next, as illustrated in FIG. 15E, a P-contact hole 24P and an N-contact hole 24N are formed in the protection layer 23. The P-contact hole 24P is disposed on the P-electrode layer 10, and the N-contact hole 24N is disposed on the residual N-portion 22.

Figure 15F:
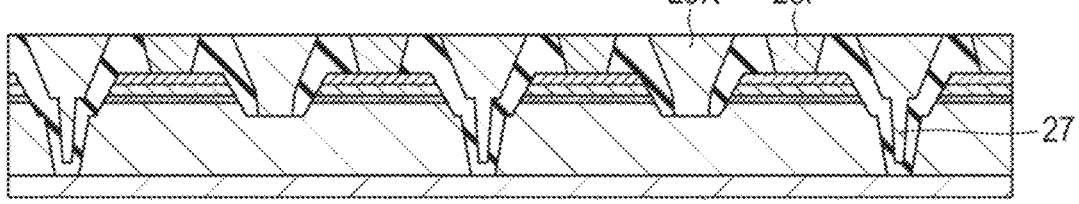
Figure 17B:
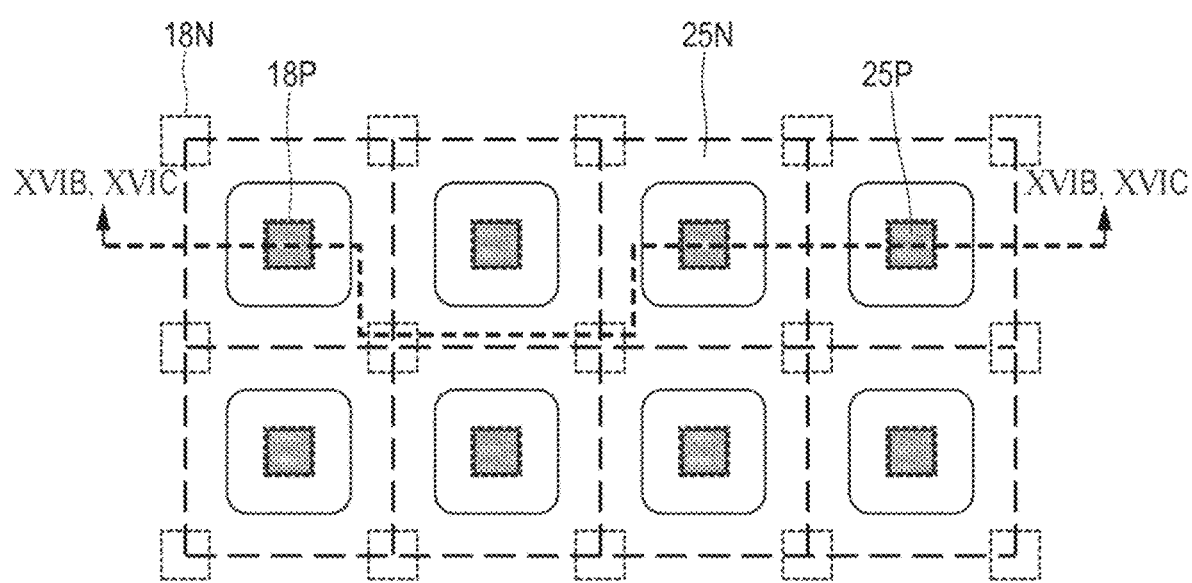

Next, as illustrated in FIG. 15F, a metal material is deposited, and a surface is dry etched back or polished by CMP, then the metal material is left in a recessed portion, thereby a lower P-electrode 25P is formed in the P-contact hole 24P. A lower N-electrode 25N is formed in the N-contact hole 24N. Furthermore, the metal material filling a gap 26 portion becomes the reflective light shielding portion 27. A plan view of this state is illustrated in FIG. 17B. The metal material deposited in the present process is made of a material having a high reflectance to the light emitted from the micro light emission element 100e. Generally, the metal material is aluminum or silver. That is, in the micro light emission element 100e, the side wall of the N-side layer 11 and the side wall of the mesa 16 are covered with the protection layer 23, and a reflective metal material is disposed outside the protection layer 23 to shield the micro light emission elements 100e from outgoing and incoming light.

Figure 16A:
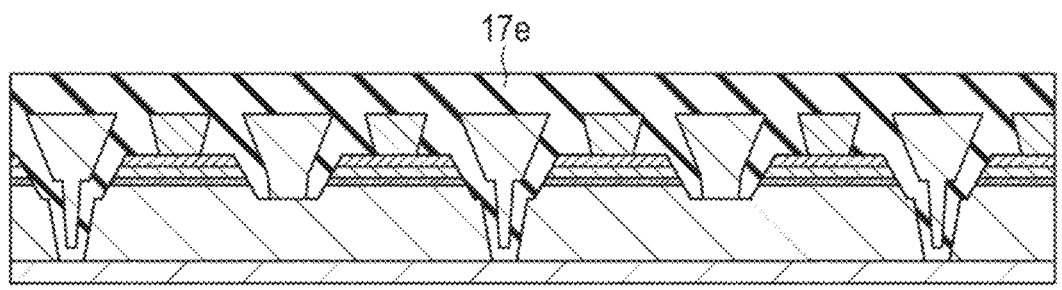
FIGS. 16A to 16C are schematic sectional views illustrating a manufacturing process of the micro light emission element according to Embodiment 6 of the present disclosure.

Next, as illustrated in FIG. 16A, a protection layer 17e is deposited, and the surface is planarized by CMP. Subsequently, as illustrated in FIGS. 16B and 16C, the P-groove 18P and the N-groove 18N are formed as in Embodiment 1, and the P-electrode 19P and the N-electrode 19N are formed by using the Damascene method.

Figure 16B:
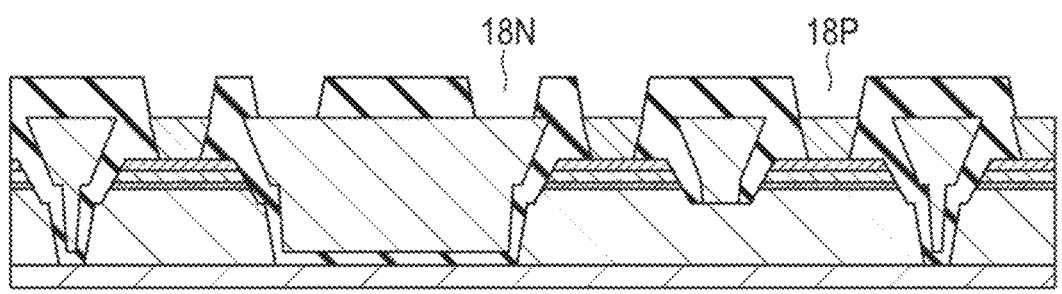
Figure 16C:
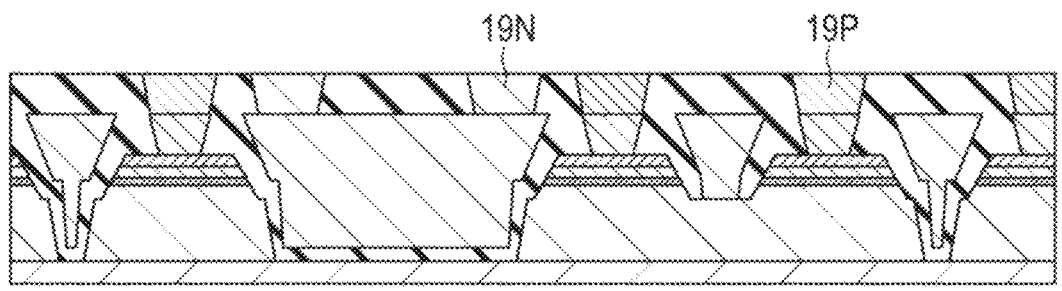

Each of FIGS. 16B and 16C is a sectional view taken along line XVIB, XVIC-XVIB, XVIC part in FIG. 17B. Since it is sufficient that the N-groove 18N is present on the lower N-electrode 25N, a degree of freedom in disposition increases, and disposing at a point where a distance to the P-electrode 19P is maximized as illustrated in FIG. 17B, it is possible to reduce a short circuit defect.

As described above, the P-electrode 19P is disposed on the mesa 16, the N-electrode 19N is disposed on the isolation trench 15, and both the P-electrode 19P and the N-electrode 19N are disposed on surfaces to be the bonding surface, and the surfaces are configured to be planarized with the same material.

Using the micro light emission element 100e, an image display device 200e can be configured as in Embodiment 2. In the configuration of the present embodiment, the micro light emission element 100e is partially coupled to the micro light emission element via the residual N-portion 22. However, since the coupling portion is very small and the other part is covered by the light shielding portion 27, light leakage is reduced and a decrease in contrast can be significantly suppressed.

Therefore the effect similar to Embodiment 2 is realizable. Furthermore, in the configuration of the present embodiment, by covering the micro light emission element 100e with a transparent insulation layer and disposing a metal with high reflectance on the outside, the reflectance can be improved and the light output can be further improved.

Furthermore, in the configuration of the present embodiment, as in Embodiment 5, the interconnection layer is not exposed to the light emitting surface. The metal material which becomes the light shielding portion 27 is covered with the protection layer 23. In this structure, when the growth substrate 9 is peeled off, tolerance to an acid or an alkaline agent is greatly improved, so that the growth substrate 9 can be easily peeled off, and productivity can be improved. In addition, when forming an external coupling portion 54 after peeling off the growth substrate 9, the coupling resistance between the metal material and the external coupling portion 54 can be reduced by etching the protection layer 23 present at a boundary surface with the growth substrate 9.

CONCLUSION

A micro light emission element according to aspect 1 of the present disclosure includes a compound semiconductor in which a first conductive layer, a light emission layer, and a second conductive layer having a conductivity type opposite to a conductivity type of the first conductive layer are sequentially laminated from a side of a light emitting surface, in which a first electrode coupled to the first conductive layer and a second electrode coupled to the second conductive layer are disposed on another surface opposite to the light emitting surface, the second electrode is disposed on the light emission layer, the first electrode is disposed in an isolation region which is a boundary region of the micro light emission element and isolates the light emission layer from a light emission layer of another micro light emission element, and a surface of the first electrode on a side of the other surface side and a surface of the second electrode on the side of the other surface side are flush with each other and are made of an identical material.

The micro light emission element according to aspect 2 of the present disclosure may be formed of a single interconnection layer, in the above-mentioned aspect 1.

According to the above configuration, each of the first electrode and the second electrode is formed on the same plane (bonding surface). Thus, in one coupling process, the first electrode and the second electrode can be simultaneously stuck to a first drive electrode and a second drive electrode of the drive circuit substrate, respectively. In addition, according to the above configuration, it is not desirable to provide any interconnection on the light emitting side of the micro light emission element. Therefore, a decrease in light emission efficiency can be suppressed and manufacturing costs can be reduced.

The micro light emission element according to aspect 3 of the present disclosure, in the above-mentioned aspect 1, in the first electrode, a first metal material is disposed on the light emitting surface side, and a second metal material is disposed on the other surface side, and the first metal material has a higher reflectance as compared to the second metal material.

In the micro light emission element according to aspect 4 of the present disclosure, in the above-mentioned aspect 1, the micro light emission element may be coupled to at least part of the other micro light emission element.

In the micro light emission element according to aspect 5 of the present disclosure, in the above-mentioned aspect 1, the micro light emission element may be completely separated from the other micro light emission element.

In the micro light emission element according to aspect 6 of the present disclosure, in the above-mentioned aspect 1, the first electrode may cover a periphery of the micro light emission element.

In the micro light emission element according to aspect 7 of the present disclosure, in the above-mentioned aspect 1, the first electrode may reach the light emitting surface.

In the micro light emission element according to aspect 8 of the present disclosure, in the above-mentioned aspect 1, the micro light emission element may be a light emitting diode, in which a side wall of an isolation trench isolating the light emission layer from the light emission layer of the other micro light emission element may be inclined at a range of 45°±10° with respect to a surface of the light emission layer.

In the micro light emission element according to aspect 9 of the present disclosure, in the above-mentioned aspect 1, the micro light emission element may have a plurality of second electrodes coupled to the second conductive layer.

In the micro light emission element according to aspect 10 of the present disclosure, in the above-mentioned aspect 1, an N-side layer and a side wall of a mesa of the micro light emission element may be covered with a protection layer, and a reflective metal material may be disposed outside the protection layer.

In the micro light emission element according to aspect 11 of the present disclosure, in the above-mentioned aspect 10, the metal material may be the first electrode.

In the micro light emission element according to aspect 12 of the present disclosure, in the above-mentioned aspect 3, an N-side layer and a side wall of a mesa of the micro light emission element may be covered with a protection layer, and the second metal material may be disposed outside the protection layer.

In the micro light emission element according to aspect 13 of the present disclosure, in the above-mentioned aspect 1, the micro light emission element may have a laser diode structure of a vertical resonator surface light emitting laser.

In an image display device according to aspect 14 of the present disclosure, in the above-mentioned aspect 1, the micro light emission element may be disposed on a drive circuit substrate, and the second electrode and the first electrode of the micro light emission element may be coupled to a corresponding second drive electrode and a corresponding first drive electrode on the drive circuit substrate, respectively.

In the image display device according to aspect 15 of the present disclosure, in the above-mentioned aspect 14, the compound semiconductor may be disposed on an entire surface of the image display device.

In the image display device according to aspect 16 of the present disclosure, in the above-mentioned aspect 15, an external coupling portion may be provided on the light emitting surface of the compound semiconductor.

In the image display device according to aspect 17 of the present disclosure, in the above-mentioned aspect 16, the image display device may have a region where an electrode is disposed on one of a side of the micro light emission element and a side of the drive circuit substrate, at a bonding surface of the micro light emission element and the drive circuit substrate.

A method of forming a micro light emission element according to aspect 18 of the present invention includes a process of sequentially depositing a first conductive layer, a light emission layer, and a second conductive layer having a conductivity type opposite to a conductivity type of the first conductive layer on a growth substrate and growing a compound semiconductor, a process of forming an isolation trench that isolates the light emission layer of the compound semiconductor for each micro light emission element on the growth substrate, a process of depositing a protection layer on the isolation trench and planarizing a surface of the isolation trench, and a process of forming a second electrode coupled to the second conductive layer on the light emission layer, and forming a first electrode coupled to the first conductive layer on the isolation trench, in which the respective surfaces of the second electrode and the first electrode are formed to be planarized.

A method of forming an image display device according to aspect 19 of the present invention includes a process of forming a micro light emission element by using the method of forming a micro light emission element according to aspect 14, a process of forming, on a semiconductor substrate, a drive circuit that drives the micro light emission element, a process of bonding the micro light emission element to a surface of the semiconductor substrate, and a process of removing the growth substrate of the micro light emission element.

[Another Expression of Present Disclosure]

The present disclosure can also be expressed as follows. That is, the micro light emission element according to an aspect of the present disclosure has a compound semiconductor in which a first conductive layer, a light emission layer, and a second conductive layer having a conductivity type opposite to a conductivity type of the first conductive layer are sequentially laminated from a side of a light emitting surface (first surface), in which the light emission layer of the compound semiconductor is divided for each micro light emission element, a second electrode coupled to the second conductive layer and a first electrode coupled to the first conductive layer are disposed on another surface (second surface) opposite to the light emitting surface (first surface) of the micro light emission element, the second electrode is disposed on the light emission layer, the first electrode is disposed in an isolation region, and surfaces of the first electrode and the second electrode are made of a same material and are configured planarized.

In addition, in the micro light emission element according to another aspect of the present disclosure, the micro light emission element may be coupled to an adjacent micro light emission element.

In addition, in the micro light emission element according to an aspect of the present disclosure, most part of the micro light emission element may be separated from the adjacent micro light emission element.

In addition, in the micro light emission element according to an aspect of the present disclosure, the micro light emission element may be completely separated from the adjacent micro light emission element.

In addition, in the micro light emission element according to an aspect of the present disclosure, the second electrode may cover most parts of a periphery of the micro light emission element.

In addition, in the micro light emission element according to an aspect of the present disclosure, the first electrode may reach a first surface.

In addition, in the micro light emission element according to an aspect of the present disclosure, in the first electrode, a first metal material may be disposed on a first surface side and a second metal material may be disposed on a second surface side, and the first metal material may have a higher reflectance as compared to the second metal material.

In addition, in the micro light emission element according to an aspect of the present disclosure, the micro light emission element may be a light emitting diode, and a side wall of an isolation trench isolating the light emission layer may be inclined at a range of $45°±10°$ with respect to a surface of the light emission layer.

In addition, in the micro light emission element according to an aspect of the present disclosure, the micro light emission element may have a plurality of second electrodes coupled to the second conductive layer.

In addition, in the micro light emission element according to an aspect of the present disclosure, the micro light emission element may have a VCSEL type laser diode structure.

In addition, in an image display device according to an aspect of the present disclosure, the micro light emission element may be disposed on a drive circuit substrate, and the second electrode and the first electrode of the micro light emission element may be coupled to a corresponding second drive electrode and a corresponding first drive electrode on the drive circuit substrate, respectively.

In addition, in the image display device according to an aspect of the present disclosure, a compound semiconductor may be disposed on an entire surface of the image display device.

In addition, in the image display device according to an aspect of the present disclosure, an external coupling portion may be provided on the first surface of the compound semiconductor.

In addition, in the image display device according to an aspect of the present disclosure, the image display device may have a region where an electrode is disposed on one of the side of the micro light emission element and a side of the drive circuit substrate, at a bonding surface of the micro light emission element and the drive circuit substrate.

In addition, a method of forming a micro light emission element according to an aspect of the present invention may include a process of sequentially depositing a first conductive layer, a light emission layer, and a second conductive layer having a conductivity type opposite to a conductivity type of the first conductive layer on a growth substrate and growing a compound semiconductor, a process of forming an isolation trench that isolates a light emission layer of the compound semiconductor for each micro light emission element on the growth substrate, a process of depositing a protection layer on the isolation trench and planarizing a surface of the isolation trench, and a process of forming a second electrode coupled to the second conductive layer on the light emission layer, and forming a first electrode coupled to the first conductive layer on the isolation trench, in which at least surfaces of the second electrode and the first electrode may be formed at the same time to be planarized.

In addition, a method of forming an image display device according to an aspect of the present invention may include a process of forming a micro light emission element by using the method of forming a micro light emission element, a process of forming, on a semiconductor substrate, a drive circuit that drives the micro light emission element, a process of bonding the micro light emission element to a surface of the semiconductor substrate, and a process of removing the growth substrate of the micro light emission element.

APPENDIX

The present disclosure is not limited to the above-described embodiments, various modifications can be made within the scope of the claims, and embodiments obtained by appropriately combining the technical means respectively disclosed in different embodiments are also included in the technical scope of the present disclosure. Furthermore, new technical features can be formed by combining the technical means disclosed in each embodiment.

The present disclosure contains subject matter related to that disclosed in Japanese Priority Patent Application JP 2018-097246 filed in the Japan Patent Office on May 21, 2018, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. An image display device comprising: a plurality of micro light emission elements disposed in a pixel region; an external coupling portion disposed in an external coupling region placed on the outside of the pixel region; and a drive circuit substrate,
   the plurality of micro light emission elements each including a compound semiconductor in which a first conductive layer, a light emission layer, and a second conductive layer having a conductivity type opposite to a conductivity type of the first conductive layer are sequentially laminated from a side of a light emitting surface,
   the plurality of micro light emission elements each further including, on a surface opposite to the light emitting surface, a second electrode coupled to the second conductive layer, the second electrode being coupled to a corresponding second drive electrode on the drive circuit substrate,
   the compound semiconductor and an external coupling electrode being disposed in the external coupling region, and the external coupling portion being electrically coupled to a corresponding electrode on the drive circuit substrate via the external coupling electrode, and
   the external coupling portion being disposed on a surface of the compound semiconductor which is the same side as the light emitting surface.

2. The image display device according to claim 1, wherein the external coupling portion is disposed on the compound semiconductor.

3. The image display device according to claim 1, wherein the external coupling portion is electrically coupled to the external coupling electrode via the first conductive layer.

4. The image display device according to claim 1, wherein the external coupling portion is directly coupled to the external coupling electrode.

5. The image display device according to claim 1, wherein the external coupling electrode has a single pillar shape.

6. The image display device according to claim 1, wherein the external coupling electrode has a plurality of pillar shapes.

7. The image display device according to claim 1, wherein the first conductive layer in the compound semiconductor in each of the plurality of micro light emission elements is coupled to the first conductive layer in the compound semiconductor in adjacent one of the plurality of micro light emission elements.

8. The image display device according to claim 1, wherein the first conductive layer in the compound semiconductor in each of the plurality of micro light emission elements is separated from the first conductive layer in the compound semiconductor in adjacent one of the plurality of micro light emission elements.

9. An image display device comprising: a plurality of micro light emission elements disposed in a pixel region; an external coupling portion disposed in an external coupling region; and a drive circuit substrate,
   the plurality of micro light emission elements each including a compound semiconductor in which a first conductive layer, a light emission layer, and a second conductive layer having a conductivity type opposite to a conductivity type of the first conductive layer are sequentially laminated from a side of a light emitting surface,
   the plurality of micro light emission elements each further including, on a surface opposite to the light emitting surface, a second electrode coupled to the second conductive layer, the second electrode being coupled to a corresponding second drive electrode on the drive circuit substrate,
   the compound semiconductor and an external coupling electrode being disposed in the external coupling region, and the external coupling portion being electrically coupled to a corresponding electrode on the drive circuit substrate via the external coupling electrode,
   a first electrode coupled to the first conductive layer being disposed on the surface opposite to the light emitting surface, and
   the first electrode being coupled to a corresponding first drive electrode on the drive circuit substrate.

10. The image display device according to claim 9, wherein the first electrode reaches the light emitting surface.

11. The image display device according to claim 9, wherein the first electrode covers a periphery of the micro light emission element.

12. An image display device comprising a pixel region, an external coupling region, a dummy region, and a drive circuit substrate,
   a plurality of micro light emission elements being disposed in the pixel region, the plurality of micro light emission elements each including a compound semiconductor in which a first conductive layer, a light emission layer, and a second conductive layer having a conductivity type opposite to a conductivity type of the first conductive layer are sequentially laminated from a side of a light emitting surface, the plurality of micro light emission elements each further including, on a surface opposite to the light emitting surface, a second electrode coupled to the second conductive layer, the second electrode being coupled to a corresponding second drive electrode on the drive circuit substrate, the external coupling region and the dummy region each having the compound semiconductor.

13. The image display device according to claim 12, wherein an external coupling portion and an external coupling electrode are disposed in the external coupling region, and the external coupling portion is electrically coupled to a corresponding electrode on the drive circuit substrate via the external coupling electrode.

14. The image display device according to claim 12, wherein the external coupling region and the dummy region each have, on a surface opposite to the light emitting surface, a second electrode coupled to the second conductive layer, and the second electrode is physically coupled to a corresponding electrode on the drive circuit substrate.

15. The image display device according to claim 12, wherein in the dummy region, the compound semiconductor is used as an optical sensor.

16. The image display device according to claim 12, wherein at a bonding surface between the driving circuit substrate and the compound semiconductor in the external coupling region or the dummy region, an insulation layer is disposed on a side of the compound semiconductor, and an electrode is disposed on a side of the drive circuit substrate which side faces the side of the compound semiconductor.

17. The image display device according to claim 12, wherein further comprising a scribe portion, the scribe portion having the compound semiconductor.

18. The image display device according to claim 17, wherein an external coupling portion and an external coupling electrode are disposed in the external coupling region, and the external coupling portion is electrically coupled to a corresponding electrode on the drive circuit substrate via the external coupling electrode.

19. The image display device according to claim 17, wherein the external coupling region and the dummy region each have, on a surface opposite to the light emitting surface, a second electrode coupled to the second conductive layer, and the second electrode is physically coupled to a corresponding electrode on the drive circuit substrate.

20. The image display device according to claim 17, wherein in the scribe portion, an electrode is disposed on one side of a bonding surface between the drive circuit substrate and the compound semiconductor, and an insulation layer is disposed on a corresponding other side of the bonding surface.

* * * * *